(12) United States Patent
Motohiro et al.

(10) Patent No.: US 7,585,933 B2
(45) Date of Patent: **\*Sep. 8, 2009**

(54) DENDRITIC POLYMER AND ELECTRONIC DEVICE ELEMENT EMPLOYING THE POLYMER

(75) Inventors: Yamahara Motohiro, Nara (JP); Satoru Obara, Inba-gun (JP); Kentaro Tada, Inba-gun (JP)

(73) Assignees: Sharp Kabushiki Kaisha, Osaka (JP); Toyo Gosei Co., Ltd., Chiba (JP)

( * ) Notice: Subject to any disclaimer, the term of this patent is extended or adjusted under 35 U.S.C. 154(b) by 577 days.

This patent is subject to a terminal disclaimer.

(21) Appl. No.: 10/521,843

(22) PCT Filed: Jul. 14, 2003

(86) PCT No.: PCT/JP03/08899

§ 371 (c)(1),
(2), (4) Date: Aug. 11, 2005

(87) PCT Pub. No.: WO2004/009680

PCT Pub. Date: Jan. 29, 2004

(65) Prior Publication Data

US 2006/0009614 A1 Jan. 12, 2006

(30) Foreign Application Priority Data

Jul. 18, 2002 (JP) ............................. 2002-210210

(51) Int. Cl.
C08G 75/00 (2006.01)
C08G 61/12 (2006.01)
C08G 83/00 (2006.01)
B05D 5/12 (2006.01)
B32B 27/00 (2006.01)
H01B 1/12 (2006.01)
H01L 51/05 (2006.01)
H01L 51/50 (2006.01)

(52) U.S. Cl. .................... 528/380; 528/373; 428/411.1; 427/58

(58) Field of Classification Search ................. 528/373, 528/380; 428/411.1; 427/58
See application file for complete search history.

(56) References Cited

FOREIGN PATENT DOCUMENTS

| JP | 63-076378 | 4/1988 |
|----|-----------|--------|
| JP | 04-133351 | 5/1992 |

(Continued)

OTHER PUBLICATIONS

Luo, Peng, Cheng, Zhong Tang, Synthesis, Light Emission, and Optical Limiting of Hyperbranced Poly[Phenylene-alt-(2,5-Thienylene)s], Polymer Preprints, 2001, p. 527-528.

(Continued)

*Primary Examiner*—Duc Truong
(74) *Attorney, Agent, or Firm*—Gomez International Patent Office, LLC; Brian A. Gomez

(57) ABSTRACT

An object of the invention is to provide a novel dendritic polymer serving as an organic semiconductor material which is isotropic and which exhibits remarkably high carrier conductivity. Another object of the invention is to provide an electronic device employing the dendritic polymer. These objects are attained by a dendritic polymer having a branching structure including repeating units each having a branch portion, each of said repeating units having a structure represented by formula (1), and containing a linear portion X formed of an optionally substituted divalent organic group and a branch portion Y formed of an optionally substituted trivalent organic group: characterized in that the linear portion X contains at least one thienylene moiety and is at least partially conjugated with the branch portion Y, and in that the polymer reversibly assumes an insulative state and a metallic state, depending on the presence of an external factor.

15 Claims, 3 Drawing Sheets

FOREIGN PATENT DOCUMENTS

| | | |
|---|---|---|
| JP | 05-110069 | 4/1993 |
| JP | 07-126616 | 5/1995 |
| JP | 07-206599 | 8/1995 |
| JP | 08-018125 | 1/1996 |
| JP | 09-059355 | 3/1997 |
| JP | 10-092576 | 4/1998 |
| JP | 10-310561 | 11/1998 |
| JP | 2000-336171 | 12/2000 |
| WO | WO 99/21935 | 5/1999 |

OTHER PUBLICATIONS

Esfand, Tomalia, Poly(Amidoamine)(Pamam) Dedrimers: From Biomimicry to Drug Delivery and Biomedical Applications, Drug Discovery Today, Apr. 8, 2001,p. 427-436, vol. 6, No. 8.

Lin, Gundlach, Nelson, Jackson, Pentacene-Based Organic Thin-film Transistors, IEEE Transctions on Electron Devices, Aug. 8, 1997, p. 1325-1331, vol. 44, No. 8.

Miller, Duan, Tully, Tomalia, Electrically Conducting Dendrimers, Journal American Chemistry Society, 1997, p. 1005-1010, vol. 119, No. 5.

Kakimoto, Chemistry, 1995, p. 608-612, vol. 50.

Kakimoto, Dendritic Macromolecules, Kobunshi High Polymers, 1998, p. 804-807, vol. 47. Japan.

Yoshino, Onoda, Conducting Polymer and Its Electronically and Optically Functional Devices, Polymer Electronics, 1996, p. 32, Corona, Japan.

Dodensei Kobunshi No Kiso To Oyo,Base and Applications Conductive Polymers, p. 24 IPC, Japan, 1963.

Shirota,Kobata,Noma, Starburst Molecules for Amorphous Molecular Materials, Chemistry Letters, 1989, p. 1145-1148.

Miyaura, Suzuki,Yuki Gosei Kagaku Kyokai Shi, Palladium-Catalyzed Cross-Coupling Reactions of Aryl and Vinylic Boron Compounds with Organic Halides, Journal of Synthetic Organ, 1988.

Miyaura, Suzuki,Palladium-Catalyzed Cross-Coupling Reactions of Organoboron Compounds, Chemistry Rev., 1995, p. 2457-2483, vol. 95, No. 7.

Suzuki, Recent Advances in the Cross-Coupling Reactions of Organoboron Derivatives with Organic Electrophiles1995-1998, Journal of Organometallic Chemistry, 1999, pp. 147-168.

IMPRESSED VOLTAGE (V)

DENDRITIC POLYMER AND ELECTRONIC DEVICE ELEMENT EMPLOYING THE POLYMER

TECHNICAL FIELD

The present invention relates to a novel dendritic polymer—dendrimer or hyperbranched polymer—having carrier conductivity, and to an electronic device employing the dendritic polymer. The dendritic polymer of the present invention attains high carrier conduction at remarkably high efficiency, and thus finds utility particularly in devices requiring carrier conductivity; e.g., switching elements such as organic transistors (organic FETs, organic TFTs, etc.), solar cells, and organic EL devices.

BACKGROUND ART

Electrically conductive organic polymers have become of scientific and technical interest since the late 1970s. The polymers, which are based on a comparatively new technique, exhibit electronic and magnetic characteristics of metal as well as physical and mechanical characteristics of conventional organic polymers. Known conductive organic polymers include poly(p-phenylene)s, poly(p-phenylenevinylene)s, polyanilines, polythiophenes, polypyrroles, polyazines, polyfurans, polycenophenes, poly(p-phenylene sulfide)s, mixtures thereof, blends thereof with another polymer, and copolymers of monomers of the above-described polymers. These conductive organic polymers are conjugated-system polymers which exhibit electrical conductivity through doping caused by reaction such as oxidation, reduction, or protonization.

In recent years, efforts have been made to fabricate, from these conductive organic polymers, light-emitting elements of organic electroluminescent devices (organic EL, OLED) and active elements of field-effect transistors (organic FET, organic TFT). In one current practice, an expensive plasma CVD apparatus is used for forming an insulating layer or a semiconductor layer of an amorphous silicon TFT or polysilicon TFT, and an expensive sputtering apparatus is used for forming an electrode. In addition, film formation by CVD must be carried out at a temperature as high as 230 to 350° C., and maintenance operations such as cleaning must be carried out frequently, thereby reducing throughput. In contrast, apparatuses such as a coating apparatus and an ink-jet apparatus for fabricating organic FETs or similar devices are less expensive than the CVD apparatus and sputtering apparatus. In addition, film formation can be performed at lower temperature, and maintenance of the apparatuses is less cumbersome. Therefore, when display devices such as a liquid crystal display and an organic EL are fabricated from an organic FET, a remarkable cost reduction can be expected.

Typical organic EL devices include a transparent substrate made of material such as glass, a transparent electrode, a hole-injecting layer, a hole-transporting layer, a light-emitting layer, an electron-transporting layer, and a metal electrode. Three separate layers; namely, the hole-transporting layer, the light-emitting layer, and the electron-transporting layer, may be formed into a single hole-transporting and light-emitting layer, or into a single electron-transporting and light-emitting layer. The specific features are disclosed by Japanese Patent Application Laid-Open (kokai) Nos. 7-126616, 8-18125, 10-92576, etc. However, problems such as service life still remain unsolved for organic EL devices, and studies for improvement are under way.

Typical organic TFTs include a transparent substrate made of material such as glass, a gate substrate, a gate insulating film, a source electrode, a drain electrode, and an organic semiconductor film. By modifying gate voltage, electric charge at the interface between the gate insulating layer and the organic semiconductor film is rendered excessive or deficient, whereby the drain current flowing between the source and drain electrodes via the organic semiconductor film is varied, to thereby perform switching.

Japanese Patent Application Laid-Open (kokai) No. 63-076378 discloses that an organic TFT is fabricated from polythiophene or a polythiophene derivative serving as the aforementioned organic semiconductor film. Fabrication of an organic TFT from pentacene is disclosed in Yen-Yi Lin, David J. Gundlach, Shelby F. Nelson, and Tomas N. Jackson, IEEE Transaction on Electron Device, Vol. 44, No. 8, p. 1,325 (1997).

However, use of pentacene raises problems. For example, film formation must be performed through a vapor deposition process, and crystallinity must be elevated for enhancement of device characteristics. Another possible approach is use of a soluble pentacene derivative for enhancing processability. However, in this case, characteristics remain unsatisfactory.

Application and development of an organic semiconductor formed of polythiophene, a polythiophene derivative, or a thiophene oligomer are under way, since the organic semiconductor has excellent formability; e.g., is readily formed into thin film through electrolytic polymerization, solution coating, or a similar method. However, in this case, characteristics remain unsatisfactory.

Meanwhile, in recent years, hyperbranched polymer materials in a broad sense such as dendrimers and hyperbranched polymers have become of interest. Characteristic features of dendrimers and hyperbranched polymers include amorphousness, solubility in organic solvent, and presence of a large number of branch ends to which a functional group can be introduced. L. L. Miller et al. describe in J. Am. Chem. Soc. 1997, 119, 1,005 that a polyamide dendrimer having, at branch ends, 1,4,5,8-naphthalenetetracarboxy-diimido residues to which a quaternary pyridinium salt is bonded has isotropic electron conductivity (also referred to as "transportability"), and that the conductivity is provided by interaction of $\pi$ electrons generated by spatial overlapping of the branch end moieties. Japanese Patent Application Laid-Open (kokai) No. 2000-336171 discloses a dendrimer containing a dendron having hole-conducting moieties at branch ends and no $\pi$-electron-conjugated system including a carbonyl group and a benzene ring, as well as a photoelectric conversion device employing the dendrimer.

However, in function elements employing semiconductive or conductive polymers such as conjugated polymers, high charge conductivity of the aforementioned organic semiconductor appears along a molecular chain orientation, and varies depending on the molecular structure. In addition, semiconductive or conductive polymers such as conjugated polymers are generally rigid and cannot be dissolved or melted. Most of them cannot be dissolved in solvent. To this end, there are used derivatives of such polymers into which side chains are introduced, and oligomers thereof (see Japanese Patent Application Laid-Open (kokai) Nos. 4-133351, 63-076378, 5-110069, etc.). However, problems also arise. For example, when side chains are introduced, glass transition temperature appears, and thermochromism attributed to micro-Brownian motion is induced, resulting in temperature-dependent variation in characteristics. Use of oligomers may deteriorate reliability. Even when the side-chain-introduced polymer is used, satisfactory mobility cannot be attained.

Thus, polymerization degree must be increased, or orientation degree of the conductive organic compound must be enhanced by use of orientation film as described in, for example, Japanese Patent Application Laid-Open (kokai) No. 7-206599.

Furthermore, since conjugated polymers tend to be affected by oxygen and water, thereby readily causing deterioration, conventional organic FET elements employing the conjugated polymers have poor stability and electric characteristics and a short service life, which is problematic.

Meanwhile, a hyperbranched polymer having a thienylene-phenylene structure as a structural repeating unit is disclosed in literature (Japanese Patent No. 3074277B). However, the disclosed compounds are used as conducting materials after being doped with an electron-accepting reagent to thereby form conductivity-imparted polymer. Since the production method disclosed in this document employs polymerization based on the Grignard reaction, such a highly regulated repeating structure as a dendrimer has cannot be obtained. Thus, the compound synthesized through this method has a wide molecular weight distribution profile, as is the case with customary polymers. In addition, when functional groups are attempted to be introduced to a core serving as a center moiety or end groups serving as a molecular surface, these functional groups are introduced randomly, raising a problem that a desired function is difficult to attain.

DISCLOSURE OF THE INVENTION

The present invention has been made in order to solve the aforementioned problems arising in conventional techniques. Thus, an object of the present invention is to provide a novel dendritic polymer serving as an organic semiconductor material which is isotropic and which exhibits remarkably high carrier conductivity. Another object of the invention is to provide an electronic device employing the dendritic polymer.

The present inventors have carried out extensive studies in order to solve the aforementioned problems, and have found that a dendritic polymer produced from a repeating unit containing at least one thienylene moiety possesses semiconducting characteristics and can serve, without requiring doping, as an organic semiconductor material which is isotropic and which exhibits remarkably high carrier conductivity. The present invention has been accomplished on the basis of this finding.

Accordingly, a first mode of the present invention to solve the aforementioned problems is drawn to a dendritic polymer having a branching structure including repeating units each having a branch portion, each of said repeating units having a structure represented by formula (1), and containing a linear portion X formed of an optionally substituted divalent organic group and a branch portion Y formed of an optionally substituted trivalent organic group:

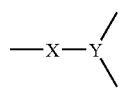
(1)

characterized in that the linear portion X contains at least one thienylene moiety and is at least partially conjugated with the branch portion Y, and in that the polymer reversibly assumes an insulative state and a metallic state, depending on the presence of an external factor.

A second mode of the present invention is directed to a dendritic polymer mentioned in relation to the first mode, wherein the external factor is electricity.

A third mode of the present invention is directed to a dendritic polymer mentioned in relation to the first mode, wherein the external factor is photoexcitation.

A fourth mode of the present invention is directed to a dendritic polymer mentioned in relation to any one of the first to third modes, containing substantially no doping reagent.

A fifth mode of the present invention is directed to a dendritic polymer mentioned in relation to any one of the first to fourth modes, wherein the portion X included in the repeating unit and serving as a starting point of the branching structure is further bonded to a center moiety serving as a core.

A sixth mode of the present invention is directed to a dendritic polymer mentioned in relation to the fifth mode, wherein the core is a group having a valence of at least two to which at least two of the repeating unit can be directly bonded.

A seventh mode of the present invention is directed to a dendritic polymer mentioned in relation to any one of the first to sixth modes, wherein the portion Y included in the repeating unit and serving as an end of the branching structure is bonded to end moieties which are different from the repeating unit.

A eighth mode of the present invention is directed to a dendritic polymer mentioned in relation to any one of the first to seventh modes, wherein the branch portion Y includes, as a branching center, a chemical entity selected from among chain hydrocarbons (aliphatic hydrocarbons), cyclic hydrocarbons (including alicyclic compounds and aromatic compounds), and heterocyclic compounds (including aromatic heterocyclic compounds and non-aromatic heterocyclic compounds).

A ninth mode of the present invention is directed to a dendritic polymer mentioned in relation to the eighth mode, wherein the branch portion Y is selected from among the. moieties represented by formula (2):

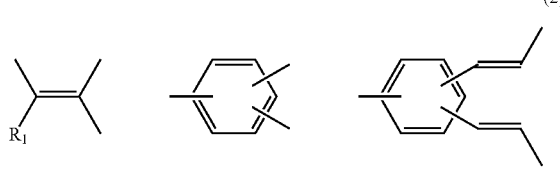
(2)

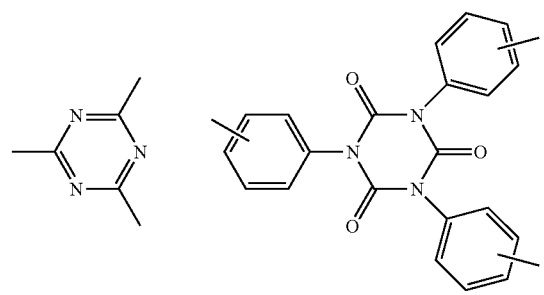

-continued

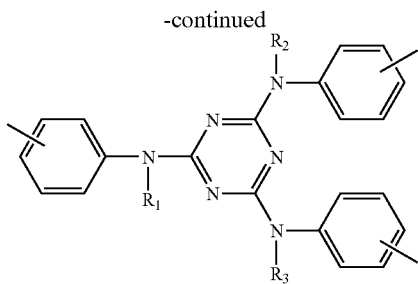

wherein each of $R_1$, $R_2$, and $R_3$ represents a hydrogen atom or an alkyl group.

A tenth mode of the present invention is directed to a dendritic polymer mentioned in relation to any one of the first to ninth modes, wherein the linear portion X is represented by formula (3), and is at least partially conjugated with the branch portion Y:

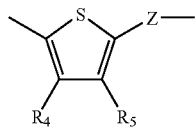

(3)

wherein Z represents a single bond or an optionally substituted divalent organic group which is at least partially conjugated with thienylene; and each of $R_4$ and $R_5$ is selected from hydrogen, an alkyl group, and an alkoxy group.

An eleventh mode of the present invention is directed to a dendritic polymer mentioned in relation to the tenth mode, wherein the substituent Z is a substituent formed from a moiety selected from the group consisting of substituted or unsubstituted chain hydrocarbon (aliphatic hydrocarbon) moieties, substituted or unsubstituted cyclic hydrocarbon (including alicyclic compound and aromatic compound) moieties, and substituted or unsubstituted heterocyclic compound (including aromatic heterocyclic compound and non-aromatic heterocyclic compound) moieties; a substituent formed from a plurality of same moieties continuously linked together selected from said group; or a substituent formed from a plurality of different moieties continuously linked together selected from said group.

A twelfth mode of the present invention is directed to a dendritic polymer mentioned in relation to the eleventh mode, wherein the substituent Z is a substituent formed from a moiety selected from the group consisting of substituted or unsubstituted unsaturated aliphatic hydrocarbon moieties and substituted or unsubstituted cyclic or heterocyclic aromatic compound moieties; a substituent formed from a plurality of same moieties continuously linked together selected from said group; or a substituent formed from a plurality of different moieties continuously linked together selected from said group.

A thirteenth mode of the present invention is directed to a dendritic polymer mentioned in relation to the twelfth mode, wherein the substituent Z is a substituent formed from a moiety selected from the group represented by formula (4); a substituent formed from a plurality of same moieties continuously linked together selected from said group; or a substituent formed from a plurality of different moieties continuously linked together selected from said group:

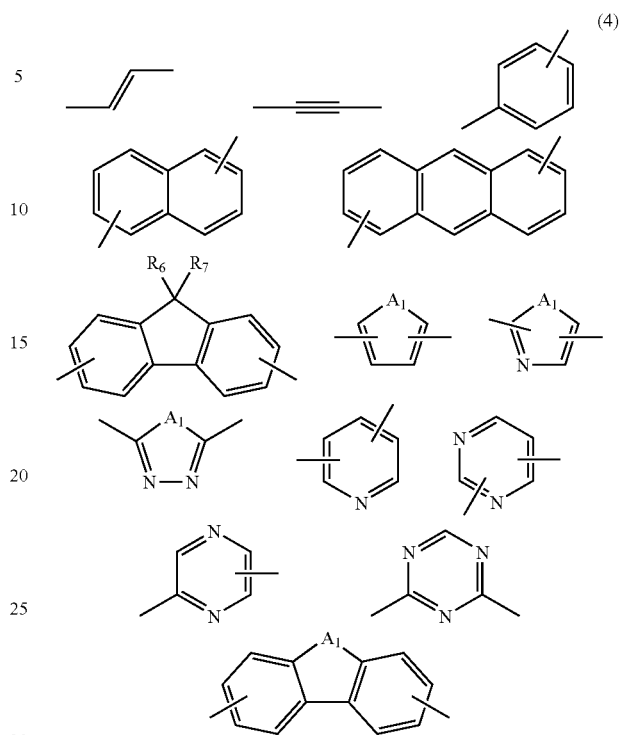

(4)

wherein $A_1$ represents O, S, or N—$R_8$, and each of $R_6$, $R_7$, and $R_8$ represents a hydrogen atom or an alkyl group.

An fourteenth mode of the present invention is directed to a dendritic polymer mentioned in relation to any one of the first to ninth modes, wherein the repeating unit is represented by formula (5):

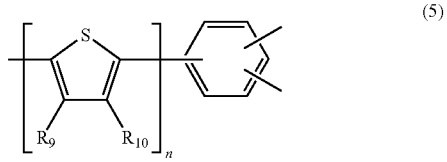

(5)

wherein each of $R_9$ and $R_{10}$ is selected from hydrogen, an alkyl group, and an alkoxy group, and n represents an integer of 1 to 10.

A fifteenth mode of the present invention is directed to a dendritic polymer mentioned in relation to any one of the first to fourteenth modes, which is a dendrimer.

A sixteenth mode of the present invention is directed to an electronic device element characterized by employing a dendritic polymer as recited in relation to any one of the first to fifteenth modes.

A seventeenth mode of the present invention is directed to an electronic device element mentioned in relation to the sixteenth mode, which is a charge-transporting device element.

A eighteenth mode of the present invention is directed to an electronic device element mentioned in relation to the sixteenth mode, which is a switching transistor element.

A nineteenth mode of the present invention is directed to an electronic device element mentioned in relation to the sixteenth mode, which is a light-emitting device element.

A twentieth mode of the present invention is directed to an electronic device element mentioned in relation to the sixteenth mode, which is a photoelectric conversion device element.

DETAILED DESCRIPTION OF PREFERRED EMBODIMENTS

Figure 1:
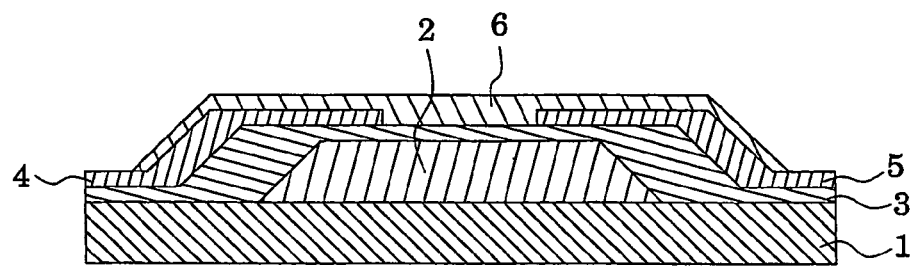
FIG. 1 schematically shows a cross-section of an organic thin film switching transistor according to Example 1 of the present invention.

The present invention will next be described in detail.

In the present invention, the term "dendritic polymer" conceptually refers to a polymer species which includes generally defined dendrimers and hyperbranched polymers. Thus, the dendritic polymer encompasses any compounds having a structure in which the aforementioned structural repeating unit represented by formula (1) (i.e., dendritic structural unit) is repeated once or more (i.e., the dendritic polymer contains two or more repeating units). Notably, a structure including the aforementioned structural repeating unit represented by formula (1); i.e., a structure including the repeating units repeated with the divergence-shaped, is referred to as a "branching structure."

Dendrimer and hyperbranched polymers are generally represented by the following structural formulas. As shown in the formulas, the dendrimer has a regularly repeated branching structure, while the hyperbranched polymer has an irregularly repeated branching structure. These polymers may have a structure in which the polymer chains are dendritically branched from one focal point, or a structure in which polymer chains are radiated from a plurality of focal points linked to a polyfunctional molecule serving as a core. Although other definitions of these species may also be acceptable, in any case, the dendritic polymer of the present invention encompasses dendritic polymers having a regularly repeated branching structure and those having an irregularly repeated branching structure, wherein these two types of dendritic polymers may have a dendritically branching structure or a radially branching structure.

According to a generally accepted definition, when a dendritic structural unit extends from its preceding dendritic structural unit as an exact copy thereof, the extension of the unit is referred to as the subsequent "generation." It should be noted that the definition of a "dendritic polymer" according to the present invention covers those having a structure in which each of the dendritic structural units which are similar to one another with the same basic structure are repeated at least once also fall within the scope of the present invention.

The concepts in relation to dendritic polymer, dendrimer, hyperbranched polymer, etc. are described in, for example, Masaaki KAKIMOTO, Chemistry, Vol. 50, p. 608 (1995) and Kobunshi (High Polymers, Japan), Vol. 47, p. 804 (1998), and these publications can be referred to and are incorporated herein by reference. However, the descriptions in these publications should not be construed as limiting the present invention thereto.

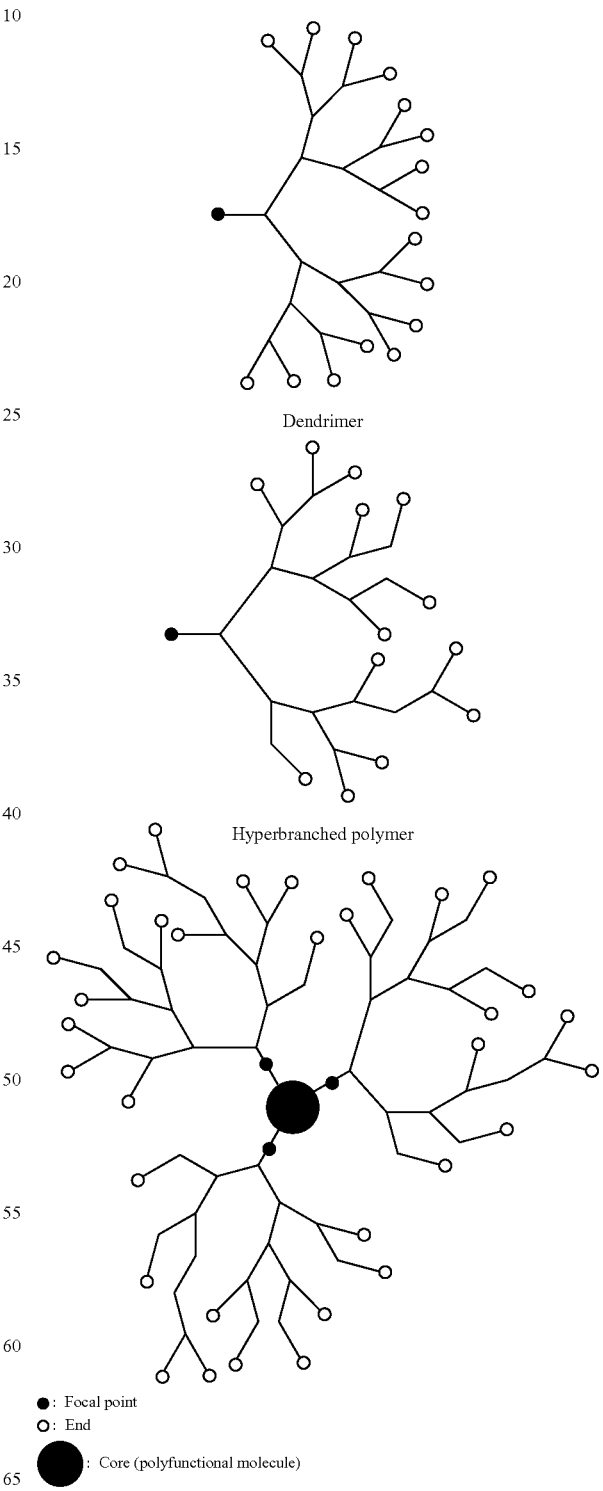

Dendrimer

Hyperbranched polymer

● : Focal point
○ : End
● : Core (polyfunctional molecule)

In the dendritic polymer of the present invention, a dendritic structural unit is formed of a linear portion X and a branch portion Y. The structure in which the dendritic structural unit is repeated once to provide a two-stage structure is in fact "a structure in which each of the branch portions Y of that structural unit is bonded to another but identical structural unit." The resultant structure is referred to as a "1st-generation dendron." A similar structure in which dendritic units having the same structure are successively linked to the bonding hands of the branch portions Y of a 1st-generation dendron is referred to as a "2nd-generation dendron. In a similar manner, an nth-generation dendron is created. Such dendrons per se and dendrons to which a desired substituent or substituents are bonded to the ends or the focal point thereof are referred to as "dendrimers or hyperbranched polymers of dendritically branching structure." When a plurality of dendritically branched dendrimers or hyperbranched polymers, which are identical to or different from one another, are bonded as subunits to a multivalent core, the formed dendritic polymer is called "dendrimer or hyperbranched polymer of radially branching structure." Notably, a dendritic polymer in which nth-generation dendrons are linked to an r-valent core is defined as an nth-generation, r-branched dendrimer. Herein, a 1st-generation, 1-branched polymer in which the 1st-generation dendron is bonded to the mono-valent core also falls within the scope of the dendritic polymer of the present invention. However, in order to attain the objects of the present invention, dendritic polymers of at least 1st-generation, 2-branched species or of at least 2nd-generation, 1-branched species are preferred. Generally, such dendritic polymers preferably have a molecular weight of 600 or more.

The dendritic polymer of the present invention has a structure in which the linear portion X contains at least one thienylene moiety and is at least partially conjugated with the branch portion Y, and preferably has a linear portion X represented by formula (3). Therefore, the dendritic polymer provides an organic semiconductor material which is isotropic and which exhibits remarkably high carrier conductivity.

As used herein, the expression "at least partially conjugated with" refers not only to the case where a perfect conjugated system is established, but also to the case where not all the electrons of the π-electron systems are ubiquitously present. For example, a conjugated system containing an m-substituted benzene nucleus also falls within the meaning of this definition.

By virtue of such a structure, the dendritic polymer of the present invention reversibly assumes an insulative state and a metallic (conductive) state, depending on the presence of an external factor. Generally, the external factor is derived from electricity, photoexcitation, etc. Electromagnetic excitation and mechanical outer force may also be employed.

Specifically, when an external factor is applied to the dendritic polymer of the present invention, a polaron state—an orbit or state differing in energy from a bipolaron—is attained, whereby a semiconducting characteristic attributed to polaron hopping conduction is expressed. In other words, when the dendritic polymer of the present invention assumes a polaron state, a polaron orbit is generated in a forbidden band included in the energy band of the polymer. Although this phenomenon similarly occurs in the case of bipolaron, the generated polaron state is unstable. Therefore, the polaron state is maintained during application of an external factor, but is broken out or is not formed in the presence of a weak external factor or in the absence of the external factor.

Accordingly, the dendritic polymer of the present invention assumes either an insulative state or a conductive state, depending on the presence of such an external factor; i.e., exhibits semiconducting characteristics. Although application of the external factor possibly leads to an insulative state or a metallic state, the conductive state is generally attained through application of the external factor. Herein, the term "insulative state" refers to a state of insulation involving a band gap (forbidden band width) of, for example, approximately 2.5 eV. The term "metallic (conductive) state" refers to a state of conduction involving a band gap (forbidden band width) between the valence electron band and the lower-energy polaron band of, for example, approximately 0.4 eV.

The dendritic polymer of the present invention exhibits the aforementioned semiconducting characteristics even when it contains no substantial doping reagent. However, the dendritic polymer may be doped with a certain dopant to thereby stabilize semiconducting characteristics or may be doped to thereby express semiconducting characteristics.

Examples of the doping reagent include n-type or p-type dopants generally employed in conductive polymers. Specific examples include alkali metals, alkylammonium ions, halogens, Lewis acids, protic acids, and transition metal halides. In addition, dopants described in "Kobunshi Electronics (Polymer Electronics,Japan)," published by Corona, p. 32 and those described in "Dodensei Kobunshi No Kiso To Oyo (Base and Applications Conductive Polymers,Japan)," published by IPC, p. 24 may also be employed.

Notably, the dendritic polymer employed in the present invention may be endowed, on the molecular surface, with hole conductivity, electron conductivity, or ion conductivity so as to enhance the aforementioned semiconducting properties and carrier conductivity.

No particular limitation is imposed on the structure of the dendritic polymer of the present invention, so long as the linear portion X contains at least one thienylene moiety and is at least partially conjugated with the branch portion Y. However, since an object of the invention is to attain high carrier conductivity, the portion X preferably has a structure represented by formula (3).

The substituent Z in the above formula is a single bond or an optionally substituted divalent organic group which is at least partially conjugated with thienylene. For example, the substituent Z is a substituent formed from-a moiety selected from the group consisting of substituted or unsubstituted chain hydrocarbon (aliphatic hydrocarbon) moieties, substituted or unsubstituted cyclic hydrocarbon (including alicyclic compound and aromatic compound) moieties, and substituted or unsubstituted heterocyclic compound (including aromatic heterocyclic compound and non-aromatic heterocyclic compound) moieties; a substituent formed from a plurality of same moieties continuously linked together selected from said group; or a substituent formed from a plurality of different moieties continuously linked together selected from said group. Each of these component moieties is at least partially conjugated with another component moiety. Each of $R_4$ and $R_5$, which may be different from each other, represents a hydrogen atom, an alkyl group, or an alkoxy group. In the present specification, unless otherwise specified, groups such as an alkyl group and an alkoxy group have 1 to 20 carbon atoms.

Preferably, the substituent Z is a substituent formed from a moiety selected from the group consisting of substituted or unsubstituted unsaturated aliphatic hydrocarbon moieties and substituted or unsubstituted cyclic or heterocyclic aromatic compound moieties; a substituent formed from a plurality of same moieties continuously linked together selected from said group; or a substituent formed from a plurality of different moieties continuously linked together selected from said group. More preferably, the substituent Z is a substituent formed from a moiety selected from the group represented by formula (4); a substituent formed from a plurality of same moieties continuously linked together selected from said group; or a substituent formed from a plurality of different moieties continuously linked together selected from said group.

Specific examples of preferred groups which can be used as the linear portion X include, but are not limited to, the groups represented by the following formula (6).

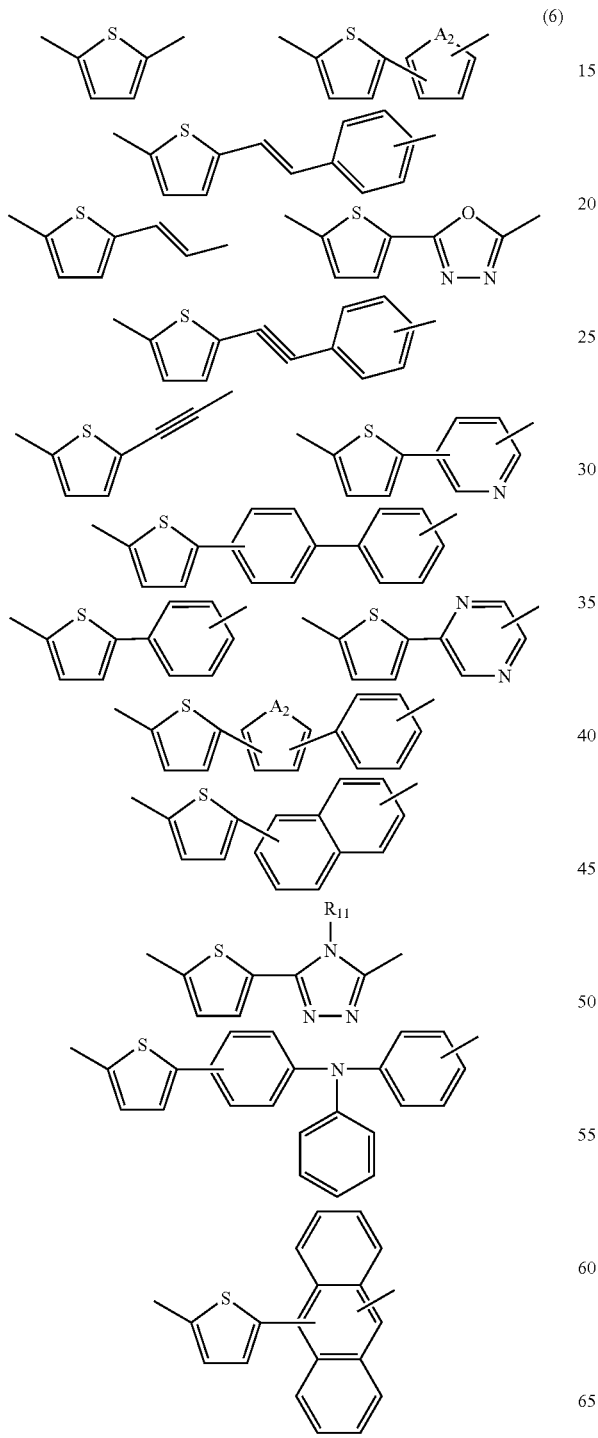

(6)

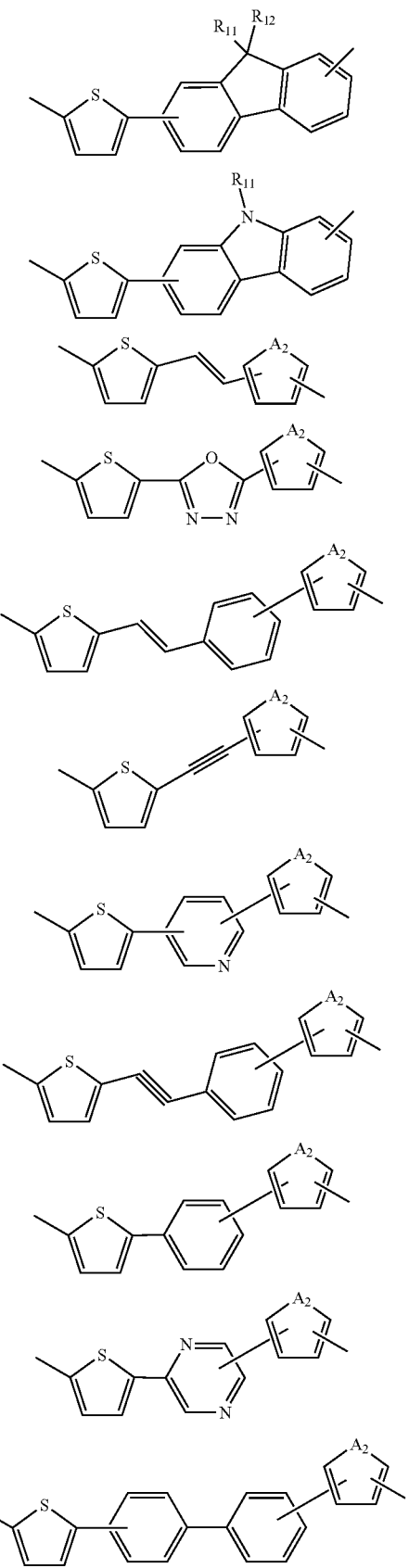

-continued

-continued

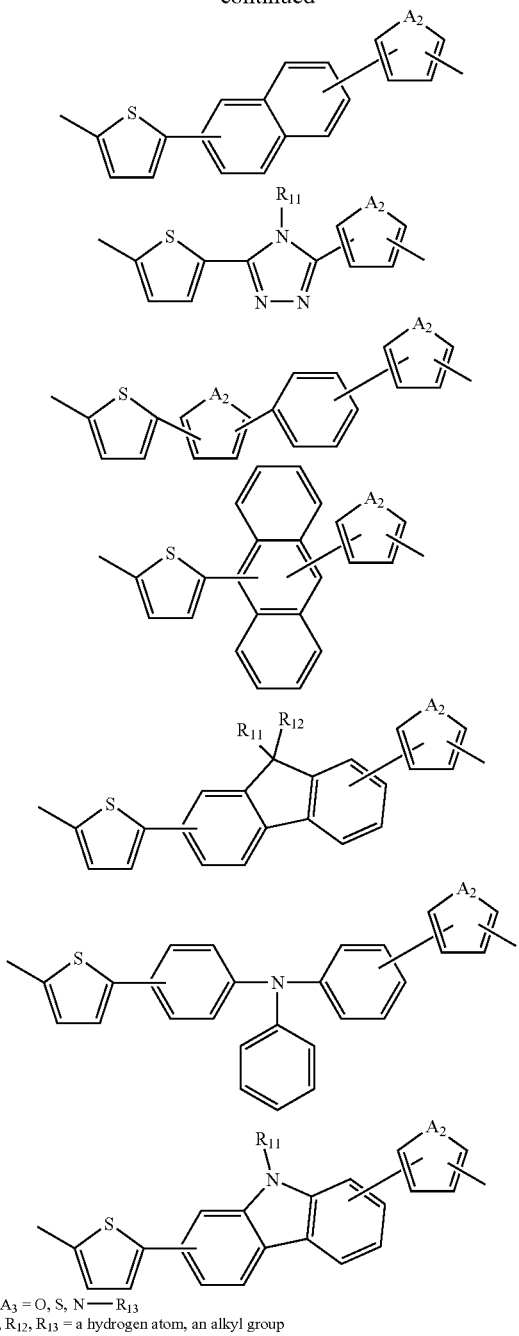

A₂, A₃ = O, S, N—R₁₃
R₁₁, R₁₂, R₁₃ = a hydrogen atom, an alkyl group

No particular limitation is imposed on the structure of the branch portion Y of the dendritic polymer of the present invention, so long as the portion Y is a trivalent organic group and is at least partially conjugated at least with the linear portion X. However, the branch portion Y preferably includes, as a branching center, a chemical entity selected from among chain hydrocarbons (aliphatic hydrocarbons), cyclic hydrocarbons (including alicyclic compounds and aromatic compounds), and heterocyclic compounds (including aromatic heterocyclic compounds and non-aromatic heterocyclic compounds).

The entirety of the branch portion Y may be a trivalent organic group formed from a moiety selected from the group consisting of substituted or unsubstituted chain hydrocarbon moieties, substituted or unsubstituted cyclic hydrocarbon moieties, and substituted or unsubstituted heterocyclic compound moieties; a trivalent organic group formed from a plurality of same moieties continuously linked together selected from said group; or a trivalent organic group formed from a plurality of different moieties continuously linked together selected from said group. Each of these component moieties is at least partially conjugated with another component moiety.

Examples of preferred branch portions Y include, but are not limited to, a structure represented by formula (2).

In one particularly preferred embodiment of the dendritic polymer of the present invention, the repeating unit represented by formula (1) has a structure represented by the aforementioned formula (5), wherein n is an integer of 1 to 10, preferably 1 to 3.

In the dendritic polymer of the present invention, a center moiety serving as a core may be bonded to the portion X in the repeating unit at starting point of a branching structure. Briefly, the core can be linked to arbitrary numbers of starting points of a dendritically branching structure, and refers to a partial structure other than a branching structure. In other word, the core serves as the center of dendritic polymer molecules, and refers to a portion of a dendritic polymer other than repeating units.

The core is preferably formed of a group which has a valence of at least 2 and to which two or more repeating units can be directly bonded. Specific examples include C1-C20 alkylene groups, C6-C20 arylene groups, and groups in which these alkylene groups and arylene groups are combined. In addition to unsubstituted alkylene groups, the alkylene groups may contain therein a heteroatom such as O, NH, N(CH₃), S, or SO₂, or may have a substituent such as a hydroxyl group, a carboxyl group, an acyl group or a halogen (e.g., fluorine, chlorine, bromine, or iodine) atom. The core may be a multivalent group of any of the above described groups from which a hydrogen atom bonded to a carbon atom is removed; a multivalent heterocyclic group; a group in which the heterocyclic group and any of the above hydrocarbon group are bonded together; a porphyrin; or a porphyrin complex. In addition to the examples of cores having a valence of at least two, a monovalent core formed by bonding hydrogen atom(s) to a multivalent core may also be used.

In the dendritic polymer of the present invention, the portion Y included in a repeating unit and serving as an end of the branching structure may be bonded to end moieties, which are different from the repeating unit. The expression "end moieties" is used to refer to a surface structure in which arbitrary numbers of ends of a dendritically or radially branching structure are bonded thereto to thereby form a molecular surface of the dendritic polymer (i.e., a partial structure excluding the dendritic or radial branches (repeating units)). No particular limitation is imposed on the structure of the end moieties of the dendritic polymer of the present invention, and moieties having hole conductivity, electron conductivity, or ion conductivity are preferably used in order to attain high carrier conductivity. Specific examples of end moieties include, but are not limited to, those represented by the following formula (7). No particular limitation is imposed on the mode of bonding between these end moieties and dendritic structural units, and examples thereof include carbon-carbon bond, carbon-nitrogen bond, amido bond, ether bond; ester bond, and urea bond.
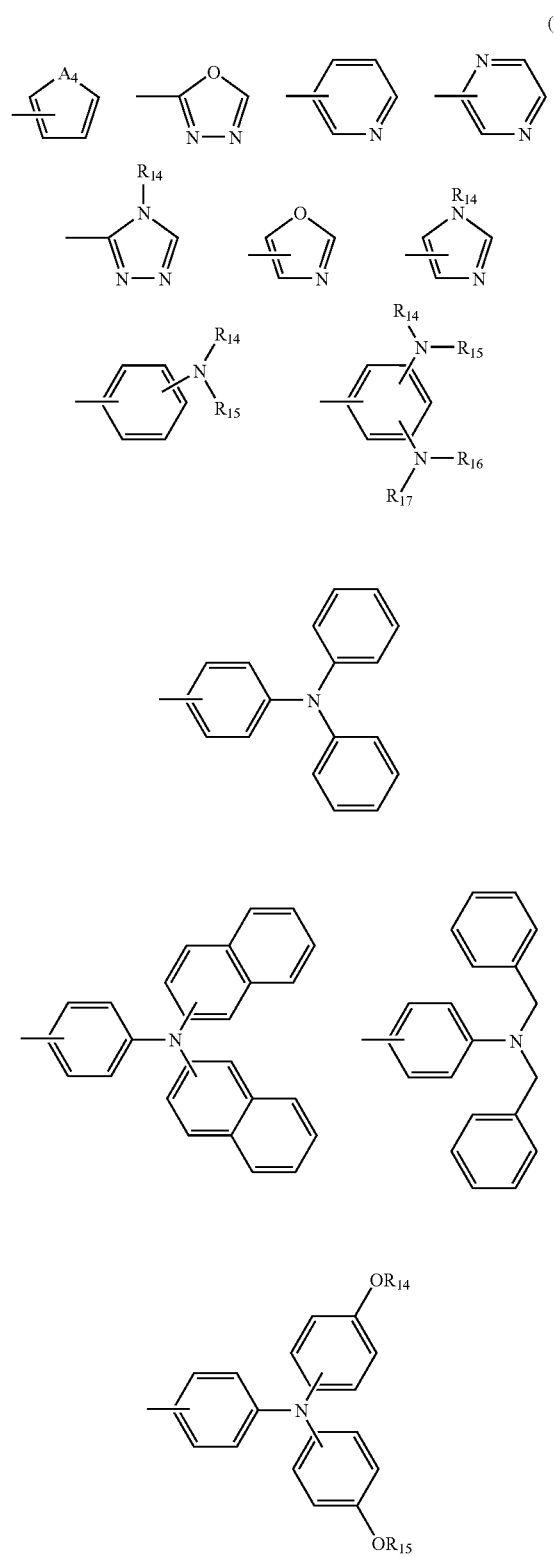
(7)
-continued
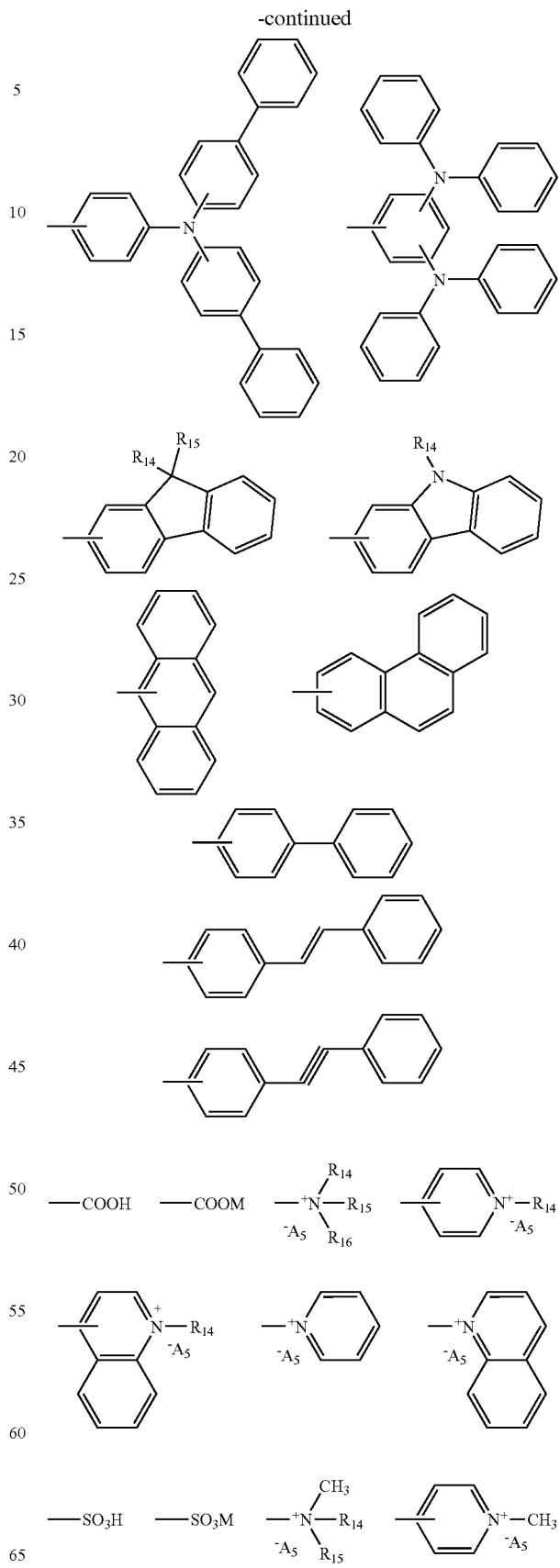

-continued

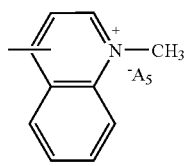

$A_4$ = O, S, N—$R_{18}$
$R_{14}$ to $R_{18}$ = a hydrogen atom or an alkyl group
$A_5$ = Cl, Br, I
$A_6$ = $CH_3SO_4$
M = Li, Na, K, ammonium, monoalkylammonium, dialkylammonium, trialkylammonium, or tetraalkylammonium Notably, dendritic polymers having no core(s) or end moieties also fall within the scope of the present invention. In this case, the starting point and end moieties of the branching structure of the dendritic polymer of the present invention are determined in accordance with the starting material for producing repeating units forming the branching structure. At starting point or end moieties of the branching structure, active groups of starting material may be substituted by hydrogen.

No particular limitation is imposed on the branching structure of the dendritic polymer of the present invention so long as the polymer has a dendritic structure, and the dendritic polymer does not necessarily have a completely ordered branching structure (i.e., dendrimer). No particular limitation is imposed on the number of generations of the dendritic polymer. The term "generation of dendritic polymer" refers to the expression described above. The number of generations of dendritic polymers including those having a large or long center moiety is generally 1 to 10. However, the number is preferably 1 to 8, more preferably 1 to 7, most preferably 2 to 5, from the viewpoint of spatial density of end moieties and easiness of synthesis.

As described above, the dendritic polymer of the present invention having a large number of branches provides a large number of branch ends. Through employment of the ends, the number of carriers can be increased.

Furthermore, since the dendritic polymer provides a large number of paths for carrier conduction, carrier mobility can be effectively enhanced without orienting molecules and increasing crystallinity, which have been performed for conventional conjugated polymers and low-molecule organic semiconductor materials.

The dendritic polymer of the present invention can be formed (i.e., synthesized) from a monomer containing a thienylene structure. As used herein, the term "monomer" refers to a class of low-molecular-weight compounds having a partial structure represented by formula (1), the compounds including derivatives thereof to which mutually reactive substituents are introduced, and precursors thereof. No particular limitation is imposed on the synthesis method for forming a dendritic polymer structure from a mononer, and methods which may be employed include the "divergent method" in which branches are successively extended from a focal point; the "convergent method" in which branches are extended from branch ends and the thus-connected units are finally bonded to a focal point; and polycondensation of a polyfunctional monomer of $AB_2$ type (A and B are mutually reactive functional groups). Among these methods, the "convergent method" is preferred for effectively synthesizing a high-purity dendritic polymer having no defects, from the viewpoint of no requirement for excessive amounts of starting materials and easiness of purification of products.

For example, a dendritic polymer having a structural repeating unit represented by formula (8) can be produced through the "convergent method" including reaction steps represented by scheme (9).

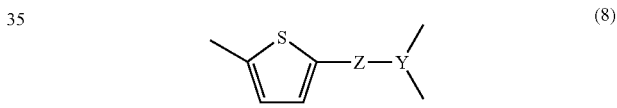

(8)

(9)

Reaction step 1

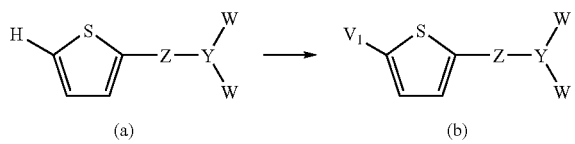

Reaction step 2

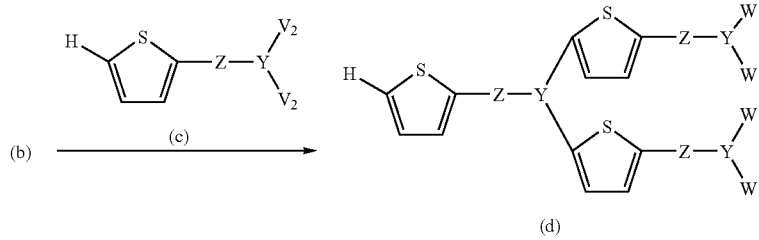

-continued
Reaction step 3
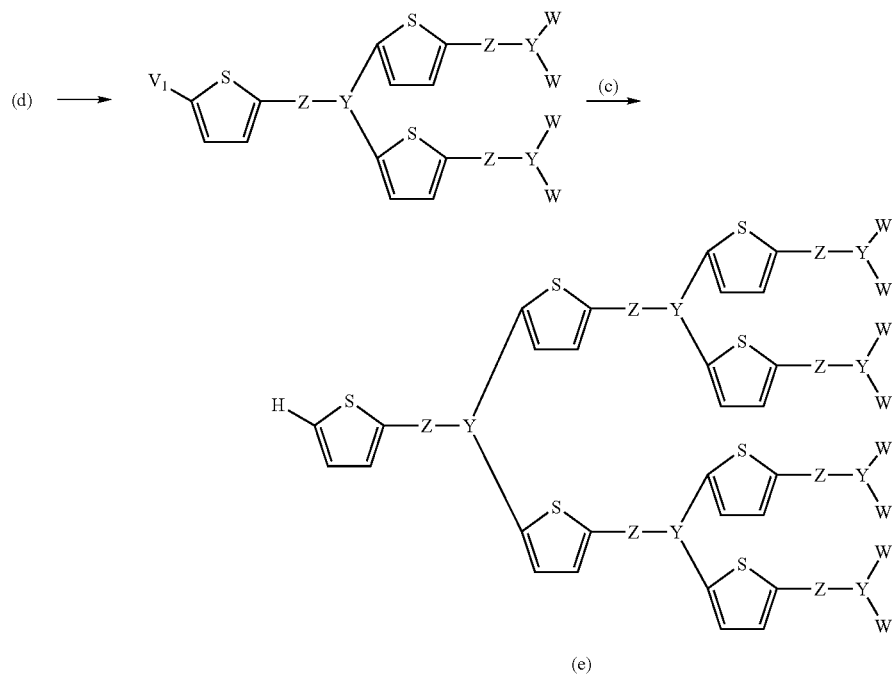
Reaction step 4
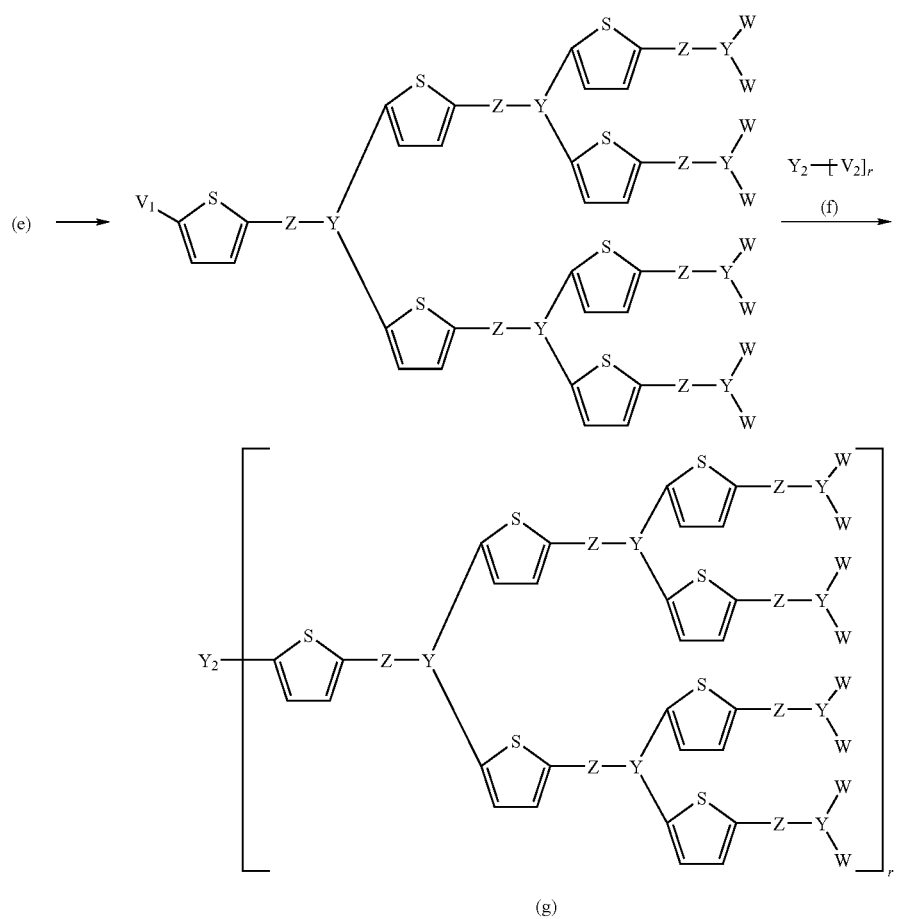

The reaction steps represented by scheme (9) include reaction step 1 in which α hydrogen of the thiophene ring of compound (a) for forming end moieties is converted to active group V₁, to thereby form compound (b); reaction step 2 in which compound (c) having a linear portion and a branch portion and two active groups V₂ at the branch portion is reacted with the compound (b), to thereby yield compound (d); and reaction step 3 in which α hydrogen of the thiophene ring of the obtained compound (d) is converted to active group V₁, and the compound (c) is reacted with V₁, to thereby form a dendron (e) of a subsequent generation. In addition, when the dendron is bonded to a center moiety molecule, there is carried out reaction step 4 in which α hydrogen of the thiophene ring of the compound (e) is converted to active group V₁, and compound (f) for forming a center moiety is reacted with V₁, to thereby form compound (g).

In the reaction scheme (9), each of $V_1$ and $V_2$ represents an active group, and W represents a monovalent organic group containing no active group which optionally has a substituent. The expression "containing no active group" means that a group which is reactive to $V_1$ or $V_2$ is not included.

$Y_2$ represents an r-valent organic group (r is an integer of $\geq 1$) serving as a core. The "r" of compound (g) refers to the number of branches generating from the center moiety. When nth-generation dendrons are bonded to a core having r of two or more, an nth-generation, r-branched dendritic polymer of a radially branching structure is obtained. When r is 1, a dendritic polymer of a dendritically branching structure is formed. In the present invention, $Y_2$ of this type of dendritic polymer is also referred to as a "core."

Among the above mentioned compounds, compound (d) can be called a 1st-generation dendrimer, whereas compound (e) can be called a 2nd-generation dendrimer. For the purpose of simple description, only denderimers of the number of generations 1 and 2 are shown in the aforementioned reaction steps 1 to 3 in scheme (9). However, dendrimers of further generations can be produced by repeating reaction step 3.

In reaction step 4, the dendrimer obtained in reaction step 3 can be bonded to a compound which can serve as a center moiety. In the above scheme, 2nd-generation dendrimers (e) are bonded to compound (f) serving as a center moiety. However, dendrimers of any generation can be bonded to a center structure molecule according to a similar reaction step. However, as also mentioned above, the number of generations of dendrimers is preferably 1 to 8, more preferably 1 to 7, most preferably 2 to 5, and the number of branches from the center moiety is preferably 1 to 6, more preferably 1 to 4, from the viewpoint of spatial density of dendritic structural units and easiness of synthesis.

No particular limitation is imposed on the method of synthesizing compound (a) serving as a starting material in reaction step 1. The compound (a) can be produced according to the following reaction scheme (10) in which W for forming end moieties is bonded to Y through reaction with $V_1$ and $V_2$.

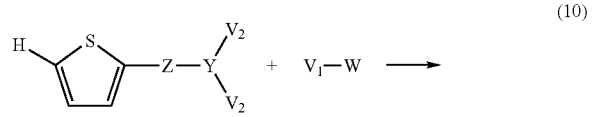

(10)

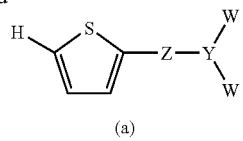

(a)

In the reaction schemes (9) and (10), dendritic polymers having an end portion in which the portion Y are bonded to two W groups are shown. However, a structure in which one W is bonded to Y or a structure in which no W is bonded to Y is also acceptable. Furthermore, Y is an organic group other than those described above. In this case, a 1st-generation dendritic polymer is synthesized in reaction step 3.

When tertiary aromatic amine skeletons—hole conductive material—are introduced to branch ends, in one possible approach, a trivalent aromatic group such as benzene nucleus is employed as Y, and nitrogen atoms are bonded directly to the nucleus. Specifically, when the compound in which $V_2$ is a halogen and $V_1$—W is a secondary aromatic amine compound represented by the following formula is employed in reaction scheme (10), the above tertiary aromatic amine skeletons can be synthesized through condensation reaction.

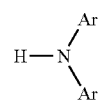

Ar: a monovalent aromatic group

Examples of the monovalent or trivalent aromatic group include substituted or unsubstituted aromatic hydrocarbon groups, aromatic heterocyclic groups, condensed polycyclic aromatic hydrocarbon groups, condensed heterocyclic aromatic groups, and monovalent or trivalent aromatic groups formed through ring-condensation of these groups. Specific examples include benzene, naphthalene, anthracene, naphthacene, pentacene, hexacene, phenanthrene, phenalene, pyrene, chrysene, benzoanthracene, perylene, triphenylene, coronene, pentaphene, picene, naphthoanthracene, trinaphthylene, ovalene, biphenyl, terphenyl, quaterphenyl, quinquphenyl, sexiphenyl, septiphenyl, phenylanthracene, phenylnaphthalene, diphenylanthracene, biphenylene, binaphthalenyl, fluorene, acenaphthylene, dibenzoperylene, indene, pentalene, acephenanthrylene, indacene, aceanthrylene, tetraphenylene, fluoranthene, azulene, cyclooctatetraene, octarene, rubrene, thiophene, furan, pyrrole, silole, oxazole, thiazole, imidazole, pyrazole, furazane, oxadiazole, thiadiazole, pyridine, thiopyran, pyrimidine, pyrazine, pyridazine, triazine, benzothiophene, benzofuran, benzosilole, indole, benzoxazole, benzothiazole, benzimidazole, quinoline, thiochromene, quinazoline, carbazole, dibenzosilole, dibenzofuran, dibenzothiophene, phenanthroline, acridine, benzoquinoline, phenanthridine, phenazine, phenothiazine, thianthrene, phenoxathiine, phenoxazine, bithiophene, terthiophene, quaterthiophene, bifuran, terfuran, quaterfuran, bipyrrole, terpyrrole, quaterpyrrole, bisilole, tersilole, quatersilole, bipyridine, terpyridine, quaterpyridine, phenylpyrrole, phenylpyridine, phenylfuran, phenylthiophene, and phenyloxadiazole. These groups may serve as monovalent aromatic groups or trivalent aromatic groups and may be substituted or unsubstituted.

The condensation reaction can be performed through, for example, Ullmann condensation (see Chem. Lett., 1145, (1989), Synth. Commu. 383, (1987), etc.) employing copper and a base catalyst, or the Toso method (Japanese Patent Application Laid-Open (kokai) No. 10-310561) employing a palladium catalyst-tri-t-butylphosphine ligand and a base catalyst. Of these, the Toso method is preferred, since reaction can be performed under mild conditions and high yield and selectivity can be attained. Through employment of the reaction, tertiary aromatic amine skeletons are introduced through, for example, the following reaction scheme.

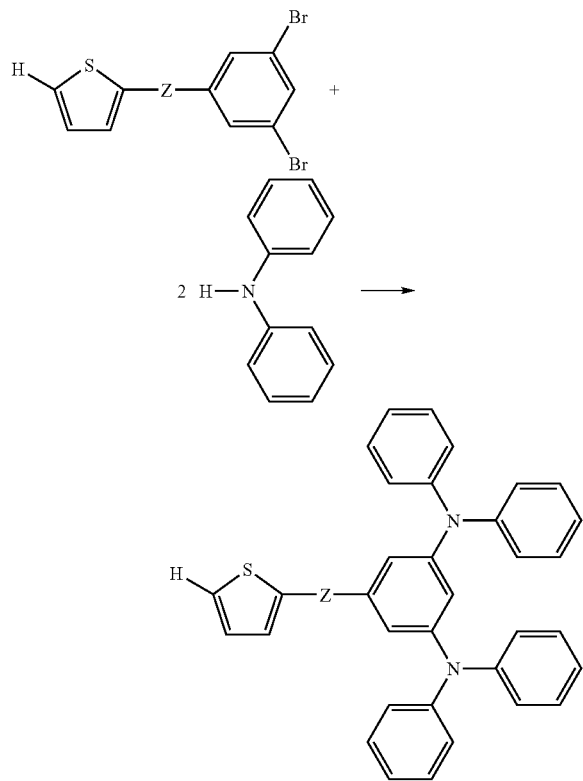

Specific reactions, conditions, etc. will next be described in more detail.

Reaction of $V_1$ and $V_2$ with compound (c) in reaction step 2 or 3 is suitably performed through cross-coupling reaction such as Suzuki cross-coupling. Examples of combinations of active groups $V_1$ and $V_2$ ($V_1$, $V_2$) include (a group selected from Group 1, a group selected from Group 2) and (a group selected from Group 3, a group selected from Group 4).

Group 1

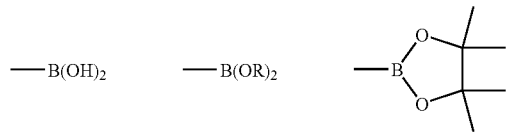

R = methyl, ethyl, isopropyl, butyl
Group 2

Cl, Br, I, $OSO_2$ ($C_kF_{2k+1}$)

k = 1, 4

-continued

Group 3

Cl, Br, I

Group 4

——$B(OH)_2$        ——$B(OR)_2$

R = methyl, ethyl, isopropyl, butyl

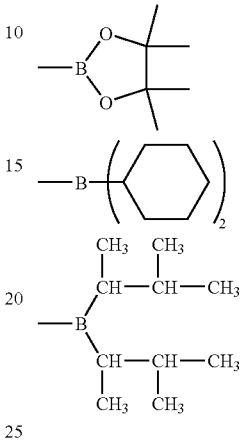

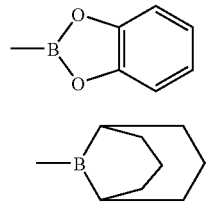

Suzuki cross-coupling reaction is known to impose few limitations on functional groups to be employed, to provide high selectivity of reaction, and to cause few side reactions such as homo-coupling, and is particularly employed for a wide range of cross-coupling reactions of aromatic compounds and vinyl compound derivatives (see Suzuki et al., Yuki Gosei Kagaku Kyokai Shi (Journal of Synthetic Organic Chemistry, Japan), 46, 848, (1988), Suzuki et al., Chem. Rev., 95, 2457 (1995), and Suzuki, J. Organomet. Chem., 576, 147 (1999)). Combinations of $V_1$ (boric acid ester; $B(OH)_2$ or $B(OR)_2$) and $V_2$ (Br or I) are preferably employed, from the viewpoint of high yield and selectivity, applicability, etc.

Suzuki cross-coupling reaction conditions under which conversion of α hydrogen of the thiophene ring to active group $V_1$ and reaction of active groups $V_1$ and $V_2$ are performed will next be described.

[Conversion of α Hydrogen of the Thiophene Ring to Active Group $V_1$]

Reaction conditions employed in reaction steps 1 and 3 for converting α hydrogen of the thiophene ring to active group $V_1$ selected from Group 1 will be described.

When $V_1$ is formed from $B(OR)_2$ or the boric acid ester represented by the following formula, α hydrogen of the thiophene ring is drawn through the action of alkyllithium (e.g., n-butyllithium), lithium diisopropylamide, etc., to thereby form the corresponding carbanion, and subsequently, the corresponding alkoxyborane (i.e., trimethoxyborane, triethoxyborane, triisopropoxyborane, tributoxyborane, or 2-isopropoxy-4,4,5,5-tetramethyl-1,3,2-dioxabororane) is electrophilically added to the carbanion.

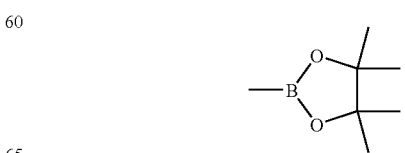

Examples of preferably employed solvents include organic solvents such as tetrahydrofuran, n-hexane, diethyl ether, and toluene. The reactions are preferably performed for 10 minutes to three hours at −100 to 30° C., more preferably for 30 minutes to two hours at −78 to 0° C.

When $V_1$ is formed from $B(OH)_2$, any of the boric acid esters obtained in the above manner is hydrolyzed through addition of water. Although no particular limitation is imposed on the reaction solvent, water is directly added to the reaction mixture yielded upon synthesis of a boric acid ester in the above manner, to thereby perform hydrolysis. The addition of water is convenient for production. The reaction is preferably performed for one hour to three hours at 0 to 50° C.

Reaction conditions employed in reaction steps 1 and 3 for converting α hydrogen of the thiophene ring to active group $V_1$ selected from the abovementioned Group 3 will be described.

When $V_1$ is formed from any of Cl, Br, and I, the corresponding halogenating reagent is reacted, to thereby convert α hydrogen of the thiophene ring to halogen. Examples of halogenating agents include N-chlorosuccinimide, N-bromosuccinimide, and N-iodosuccinimide. Examples of preferably employed reaction solvents include organic solvents such as tetrahydrofuran, n-hexane, diethyl ether, benzene, carbon tetrachloride, carbon disulfide, dimethylformamide, and acetic acid. The reaction is preferably performed for one hour to 24 hours at −20 to 80° C.

[Reaction of Active Group $V_1$ and Active Group $V_2$]

Reaction conditions employed in reaction steps 2 and 3 for reacting $V_1$ and $V_2$ through Suzuki cross-coupling will be described.

When Suzuki cross-coupling is performed, a variety of combinations of palladium catalysts and base catalysts can be employed.

Examples of palladium catalysts include tetrakis(triphenylphosphine)palladium, palladium acetate, palladium chloride, palladium black, bis(triphenylphosphine)palladium dichloride, bis(tri-o-tosylphosphine)palladium dichloride, bis(dibenzylideneacetone)palladium, bis(tricyclohexylphosphine)palladium dichloride, bis(triphenylphosphine)palladium diacetate, [1,2-bis(diphenylphosphino)butane]palladium dichloride, and [1,2-bis(diphenylphosphino)ethane] palladium dichloride. In addition, combination of a ligand compound with these palladium catalysts may be effective. Examples of ligand compounds include triphenylphosphine, 1,1'-bis(diphenylphosphino)ferrocene, 1,2-bis(diphenylphosphino)ethane, 1,3-bis(diphenylphosphino)propane, 1,4-bis(diphenylphosphino)butane, sodium diphenylphosphinobenzene-3-sulfonate, tricyclohexylphosphine, tri(2-furyl)phosphine, tris(2,6-dimethoxyphenyl)phosphine, tris(4-methoxyphenyl)phosphine, tris(4-methylphenyl)phosphine, tris(3-methylphenyl)phosphine, and tris(2-methylphenyl)phosphine. Instead of palladium catalysts, a nickel catalyst, [1,1'-bis(diphenylphosphino)ferrocene]nickel dichloride may also be used.

Examples of base catalysts include sodium carbonate, sodium alkoxides (e.g., sodium ethoxide), t-butoxypotassium, barium hydroxide, triethylamine, potassium phosphate, sodium hydroxide, and potassium carbonate.

When Suzuki cross-coupling is performed, any of a variety of organic solvents, mixtures thereof, and mixtures thereof with water is generally used as a solvent. Examples of suitably used organic solvents include dimethylformamide, ethanol, methanol, dimethyl sulfoxide, dioxane, benzene, toluene, tetrahydrofuran, dimethoxyethane, dimethylacetamide, and xylene. The coupling reaction is performed preferably for 30 minutes to 24 hours at 25 to 150° C., more preferably for one hour to 12 hours at 25 to 80° C.

In reaction step 4 and scheme (10), conversion of α hydrogen of the thiophene ring to active group $V_1$ and reaction of $V_1$ and $V_2$ are performed in a manner similar to that employed in reaction steps 1 to 3.

The compound yielded in each reaction step is purified, whereby a high-purity dendritic polymer having few defects is synthesized. No particular limitation is imposed on the purification method, and purification methods such as recrystallization, crystallization, sublimation, and purification by means of a column may be employed.

According to the aforementioned production method, a variety of dendritic polymers can be produced by selecting species of compound (a) for forming branch ends, compound (c) serving as a monomer for forming a dendritic structure, and compound (f) for forming a center moiety. Since the production method is based on the "convergent method," in which a purification process in each reaction step is readily performed, a high-purity dendrimer (a type of dendritic polymer) having few defects can be produced.

The dendritic polymer of the present invention, having carrier conductivity, is envisaged to be used in a variety of fields. The dendritic polymer of the present invention can provide hole-transporting (p-type), electron-transporting (n-type), and a variety of functional electronic materials, by selecting the molecular structure thereof or by doping or a similar process. Thus, such electronic materials can be used in switching elements such as an organic transistor element, an organic FET element, or an organic TFT element; solar cells; photoelectric conversion elements; capacitors; light-emitting elements; electrochromic elements; polymer secondary batteries, etc. The structure of such elements suited for each purpose will next be described in detail.

The organic transistor element includes a semiconductor layer formed of an organic layer having hole transportability and/or electron transportability; a gate electrode formed of a conductive layer; and an insulating layer inserted between the semiconductor layer and the conductive layer. To the assembly, a source electrode and a drain electrode are attached, to thereby produce the transistor element. The above organic layer is formed from the dendritic polymer of the present invention.

The light-emitting device includes a pair of plate-like electrodes disposed in parallel, and an organic layer containing the material of the present invention between the two electrodes. Generally, the device is formed of a transparent electrode (e.g., ITO), a hole-injecting layer, a hole-transporting layer, a light-emitting layer, an electron-transporting layer, and a metal electrode. Carrier-transporting function and light-emitting function may be combined in a single structure. The above organic layer is formed from the dendritic polymer of the present invention.

The photoelectric conversion element or a solar cell generally contains an organic layer sandwiched by plate-like electrodes disposed in parallel. The organic layer may be formed on a comb-like electrode. No particular limitation is imposed on the location of the organic layer. No particular limitation is imposed on the material of electrodes. However, when plate-like electrodes disposed in parallel are employed, at least one electrode is preferably formed of a transparent electrode such as an ITO electrode or a fluorine-doped tin oxide electrode. The organic layer is formed of two sublayers; i.e., a layer formed of the dendritic polymer of the present invention having p-type semiconductivity or hole-transportability, and a layer formed of the dendritic polymer of the present invention having n-type semiconductivity or electron-transportability. Furthermore, when a photosensitizing dye group is introduced to the dendritic polymer contained in one of the two layers, or a polymer or hyperbranched polymer in a broad sense including a specific photosensitizing dye molecule moiety is provided between the two layers, element performance is further enhanced, and high-efficiency power generation can be attained by use of, for example, a solar cell of such a structure. Herein, the photosensitizing dye molecule moiety has a HOMO (highest occupied molecular orbital) level lower than the HOMO level of hole-transporting dendritic polymer and has a LUMO (lowest unoccupied molecular orbital) level higher than the LUMO level of electron-transporting dendritic polymer.

When an ion-conductive polymer or a dendritic polymer which satisfies conditions of photoexcitation of the hole-transporting layer or the electron-transporting layer is provided between the hole-transporting layer and the electron-transporting layer, an electrochemical photoelectric conversion element can be formed. A photosensitizing dye group may be introduced to any one of the layers in accordance with needs.

The capacitor includes a hole-transporting layer and an electron-transporting layer, one serving as a conductive layer and the other serving as a semiconductor layer, and an insulating layer inserted between the conductive layer and the semiconductor layer. Alternatively, both the hole-transporting layer and electron-transporting layer are formed of conductive layers, and an ion-conductive layer is inserted between the two conductive layers. Alternatively, the hole-transporting layer is formed of a p-type semiconductor layer and the electron-transporting layer is formed of an n-type semiconductor layer, and the layers may be stacked, to thereby form a continuously stacked multi-layer. The above semiconductor layer is formed from the dendritic polymer of the present invention.

The electrochromic element includes a hole-transporting layer formed of a polymer layer which can be doped with a p-type dopant and discolors by redox reaction; an electron-transporting layer formed of a polymer layer which can be doped with an n-type dopant and discolors by redox reaction; and a layer containing a supporting electrolyte and disposed between the two layers. The element structure may be used in a polymer secondary battery, whereby a secondary battery of high capacitance and low internal resistance is provided.

As described above, by use of the aforementioned materials according to the present invention, devices requiring carrier conductivity and having remarkably high carrier conductivity can be produced through a simple production process.

EXAMPLES

The present invention will next be described with reference to the below-described Examples in relation to the dendritic polymer and the function element using the same, which should not be construed as limiting the invention thereto. Apparatus, etc. employed in measurement are as follows.

$^1$H-NMR: FT-NMR, model JNM-AL400 (400 MHz, product of JEOL), solvent: $CDCl_3$ or DMSO-$d^6$, room temperature, chemical shift reference (0 ppm): tetramethylsilane (TMS).

GPC: HLC-8220 GPC, product of Tosoh Corporation; Column: TSK gel Super HZM-M; Eluent: THF; Detector: UV 254 nm; Measures (weight average molecular weight (Mw), number average molecular weight (Mn), and molecular weight distribution (Mw/Mn)) are reduced to polystyrene as a standard.

Synthesis Example 1

Synthesis of 3rd-Generation Dendritic Polymer

Synthesis Example 1-1

Synthesis of a compound (c), 5-(3,5-dibromophenyl)-2,2'-bithiophene, serving as a monomer providing a dendritic structure, represented by the following formula

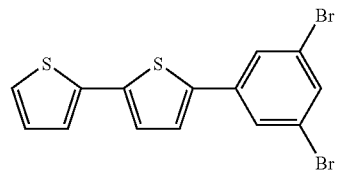

In a nitrogen atmosphere, 2,2'-bithiophene (4.6 g) was dissolved in dehydrated tetrahydrofuran, and the solution was cooled in a dry ice—methanol bath. After cooling, a 1.6M n-butyllithium/hexane solution (18 mL) was added dropwise thereto, and the mixture was allowed to react for one hour. Subsequently, trimethoxyborane (3.4 g) was added dropwise thereto, and the resultant mixture was allowed to react for one hour. After completion of reaction, water was added thereto for hydrolysis. Thereafter, the cooling bath was removed, whereby the temperature of the reaction mixture was elevated to room temperature. An aqueous saturated ammonium chloride solution and diethyl ether were added to the reaction mixture, and the resultant mixture was stirred and left to stand. The formed organic layer was isolated from the mixture, and the aqueous layer was subjected to extraction with a solvent mixture of tetrahydrofuran and diethyl ether (volume ratio: 1/2). The organic layer obtained through extraction was combined with the above organic layer, and the resultant mixture was washed with an aqueous saturated sodium chloride solution. The mixture was dried over sodium sulfate, and the solvent was distilled off under reduced pressure, to thereby yield a crude product. The crude product was recrystallized from tetrahydrofuran/n-hexane, to thereby yield 4.3 g of 2,2'-bithiophene-5-boronic acid (intermediate compound; pale bluish white solid, yield: 73%) represented by the following formula.

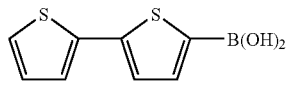

The structure of the obtained product was confirmed through $^1$H-NMR spectroscopy. The measurement data are shown below.

$^1$H NMR (DMSO-d$^6$) δ8.30 (s, BOH, 2H), δ7.60 (d, J=3.6 Hz, thiophene ring, 1H), δ7.51 (dd, J=5.2 Hz, J=1.2 Hz, thiophene ring, 1H), δ7.34-7.32 (m, thiophene ring, 2H), δ7.10 (dd, J=5.2 Hz, J=3.6 Hz, thiophene ring, 1H).

Subsequently, in a nitrogen atmosphere, the resultant intermediate compound, 2,2'-bithiophene-5-boronic acid (4.0 g) and 1,3,5-tribromobenzene (9.0 g) were dissolved in tetrahydrofuran. Palladium acetate (0.1 g) and triphenylphosphine (0.30 g) were added thereto, and a solution of sodium carbonate (4.4 g) in water (34 mL) was further added thereto. The mixture was allowed to react for six hours while heating at 80° C. in an oil bath under stirring. After completion of reaction, the temperature of the reaction mixture was lowered to room temperature, and water (30 mL) was added thereto. The resultant mixture was subjected to extraction with methylene chloride, and the formed organic layer was washed with water. The organic layer was dried over sodium sulfate, and the solvent was distilled off under reduced pressure, to thereby yield a crude product. The crude product was isolated and purified through column chromatography (packing material: Silicagel 60 (product of Merck), eluent: methylene chloride/n-hexane), to thereby yield 4.6 g of the target product (pale yellow solid, yield: 61%). The structure of the obtained product was confirmed through $^1$H-NMR spectroscopy. The measurement data are shown below.

$^1$H NMR (CDCl$_3$) δ7. 65 (d, J=1.6 Hz, benzene ring, 2H), δ7.55 (t, J=1.6 Hz, benzene ring, 1H), δ7.26-7.25 (thiophene ring, 1H), δ7.23 (d, J=3.6 Hz, thiophene ring, 1H), δ7.22 (d, J=3.6 Hz, thiophene ring, 1H), δ7.15 (d, J=3.6 Hz, thiophene ring, 1H), δ7.05 (dd, J=5.2 Hz, J=3.6 Hz, thiophene ring, 1H).

Synthesis Example 1-2

Synthesis of a compound (a), 5-[2,2']bithiophenyl-5-yl-N,N,N',N'-tetraphenyl-1,3-phenylenediamine, forming the branch ends of a dendritic structure, represented by the following formula.

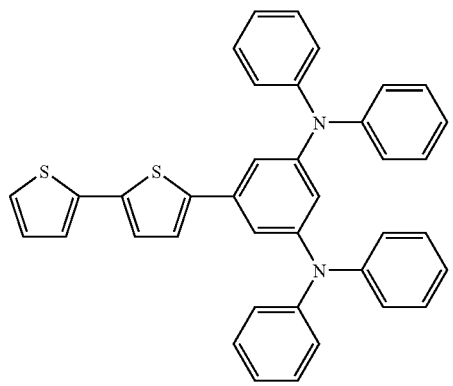

<Preparation of Catalyst>
Xylene (4.5 mL) was added to palladium acetate (10 mg) and, in a nitrogen atmosphere, tri-t-butylphosphine (36 mg) was added thereto. The mixture was heated at 80° C. for 30 minutes, to thereby prepare a catalyst solution.

<Synthesis of 5-[2,2']bithiophenyl-5-yl-N,N,N',N'-tetraphenyl-1,3-phenylenediamine>
Xylene (4.5 mL) was added to a mixture of 5-(3,5-dibromophenyl)-2,2'-bithiophene (1.80 g) which had been produced in Synthesis Example 1-1, diphenylamine (1.60 g) and t-butoxypotassium (1.21 g), and, in a nitrogen atmosphere, the previously prepared catalyst solution was added dropwise thereto at 80° C. After completion of addition, the reaction mixture was heated to 120° C., and was allowed to react for 18 hours. Subsequently, the temperature of the reaction mixture was lowered to room temperature, and water (10 mL) was added thereto. The formed organic layer was isolated from the mixture, and the aqueous layer was subjected to extraction with methylene chloride. The organic layer obtained through extraction was combined with the above organic layer. The organic layer was dried over sodium sulfate, and the solvent was distilled off under reduced pressure, to thereby yield a crude product. The crude product was isolated and purified through column chromatography (packing material: Silicagel 60 (product of Merck), eluent: methylene chloride/n-hexane), to thereby yield 2.20 g of the target product (pale yellow solid, yield: 85%). The structure of the obtained product was confirmed through $^1$H-NMR spectroscopy. The measurement data are shown below.

$^1$H NMR (CDCl$_3$) δ7.22 (t, J=7.8 Hz, benzene ring, 8H), δ7.16 (dd, J=1.2 Hz, J=5.2 Hz, thiophene ring, 1H), δ7.11-7.09 (m, thiophene ring, 1H and benzene ring, 8H), δ7.02-6.96 (m, benzene ring, 4H and thiophene ring, 3H), δ6.90 (d, J=2.0 Hz, benzene ring, 2H), δ6.73 (t, J=2.0 Hz, benzene ring, 1H).

Synthesis Example 1-3

Synthesis of a compound (b), 5-(5'-boronic acid-[2,2'] bithiophenyl-5-yl)-N,N,N',N'-tetraphenyl-1,3-phenylenediamine, represented by the following formula through conversion, to active group B(OH)$_2$, of α-hydrogen of the corresponding thiophene ring of compound (a) forming the branch ends of a dendritic structure

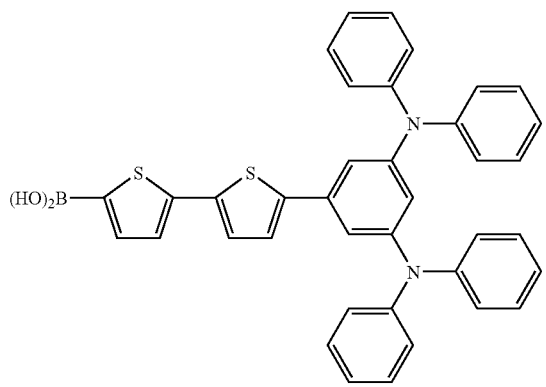

In a nitrogen atmosphere, 5-[2,2']bithiophenyl-5-yl-N,N,N',N'-tetraphenyl-1,3-phenylenediamine (2.0 g) which had been synthesized in Synthesis Example 1-2 was dissolved in dehydrated tetrahydrofuran, and the solution was cooled in a dry ice—methanol bath. After cooling, a 10-wt. % lithium diisopropylamide/n-hexane suspension (4.5 g, product of Aldrich) was added dropwise thereto, and the mixture was allowed to react for one hour. Subsequently, trimethoxyborane (0.5 g) was added dropwise thereto, and the resultant mixture was allowed to react for one hour. After completion of reaction, water was added thereto for hydrolysis. Thereafter, the cooling bath was removed, whereby the temperature of the reaction mixture was elevated to room temperature. An aqueous saturated ammonium chloride solution and diethyl ether were added to the reaction mixture, and the resultant mixture was stirred and left to stand. The formed organic layer was isolated from the mixture, and the aqueous layer was subjected to extraction with a solvent mixture of tetrahydrofuran and diethyl ether (volume ratio: 1/2). The organic layer obtained through extraction was combined with the above organic layer, and the resultant mixture was washed with an aqueous saturated sodium chloride solution. The mixture was dried over sodium sulfate, and the solvent was distilled off under reduced pressure, to thereby yield a crude product. The crude product was recrystallized from tetrahydrofuran/n-hexane, to thereby yield 1.5 g of the target product (pale yellow solid, yield: 70%). The structure of the product was confirmed through $^1$H-NMR spectroscopy (solvent for measurement: DMSO-$d^6$) from the fact that a peak attributed to the OH proton of the boronic acid is observed at about 8.3 ppm and that the ratio of the integrated value of the benzene-ring-originating protons to that of the thiophene-ring-originating protons coincides with that of the target structure product.

Synthesis Example 1-4

Synthesis of 1st-generation dendritic polymer represented by the following formula (11) through Suzuki cross-coupling reaction of compound (b) with compound (c)

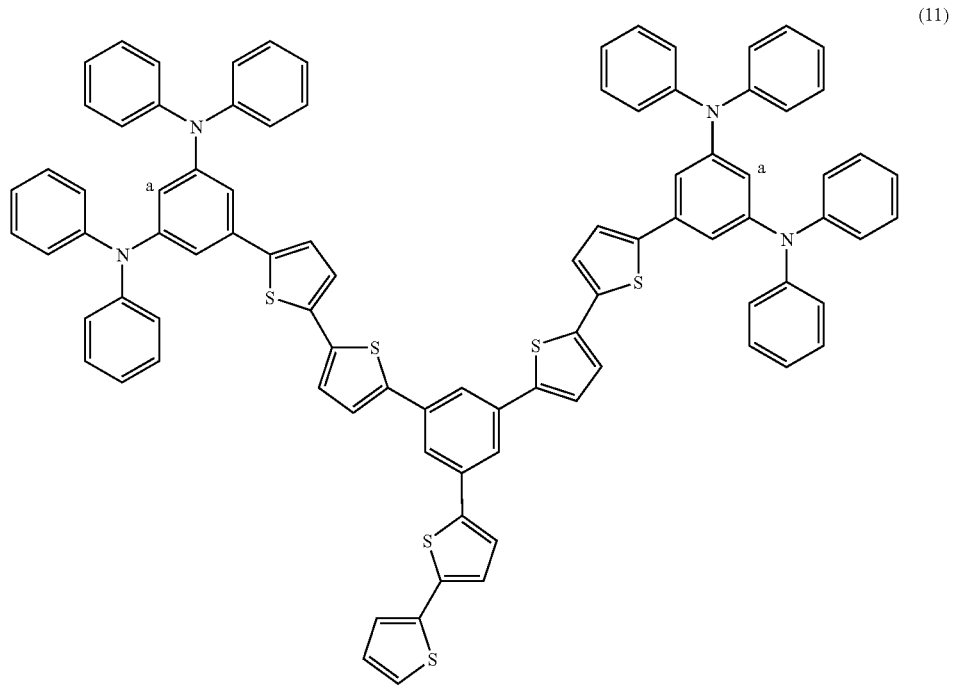

(11)

wherein, "a" represents the position of proton Ha, on which an integrated value obtained by $^1$H-NMR spectroscopy was evaluated.

In a nitrogen atmosphere, THF (10 mL) and water (2 mL) were added to a mixture of 5-(5'-boronic acid-[2,2']bithiophenyl-5-yl)-N,N,N',N'-tetraphenyl-1,3-phenylenediamine (1.30 g) which had been produced in Synthesis Example 1-3; 5-(3,5-dibromophenyl)-2,2'-bithiophene (0.40 g) which had been produced in Synthesis Example 1-1; palladium acetate (13 mg); triphenylphosphine (46 mg); and sodium carbonate (0.22 g), and the resultant mixture was allowed to react for eight hours under reflux conditions. After completion of reaction, the reaction mixture was cooled to room temperature, and water (20 mL) was added thereto. The resultant mixture was subjected to extraction with methylene chloride, and the formed organic layer was washed with water. The organic layer was dried over sodium sulfate, and the solvent was distilled off under reduced pressure, to thereby yield a crude product. The crude product was isolated and purified through column chromatography (packing material: Silicagel 60 (product of Merck), eluent: methylene chloride/n-hexane), to thereby yield 0.84 g of the target product (pale yellow solid, yield: 60%). The structure of the obtained product was confirmed through $^1$H-NMR spectroscopy (solvent for measurement: $CDCl_3$) with reference to an integrated value at 6.74 ppm (2H) attributed to benzene ring proton Ha (see formula (11)) having two adjacent nitrogen atoms, from the fact that the ratio of the integrated value of the benzene-ring-originating protons to that of the thiophene-ring-originating protons coincides with that of the target structure product. Hereinafter, in descriptions in relation to other generations, Ha also refers to a benzene ring proton having two adjacent nitrogen atoms. The measurement data are shown below. The weight average molecular weight (Mw), number average molecular weight (Mn), and molecular weight distribution (Mw/Mn), as measured through GPC were found to be 1,265, 1,241, and 1.019, respectively. These values indicate that the target polymer has high purity and assumes a single dispersion state.

$^1$H NMR ($CDCl_3$) δ7.66 (d, J=1.2 Hz, benzene ring, 2H), δ7.65 (t, J=1.2 Hz, benzene ring, 1H), δ7.32 (d, J=3.6 Hz, thiophene ring, 1H), δ7.30 (d, J=3.6 Hz, thiophene ring, 2H), δ7.25-7.22 (m, benzene ring, 16H and thiophene ring, 2H), δ7.18 (d, J=3.6 Hz, thiophene ring, 1H), δ7.13-7.10 (m, benzene ring, 16H and thiophene ring, 2H), 7.08 (d, J=3.6 Hz, thiophene ring, 2H), 7.05 (dd, J=5.2 Hz, J=3.6 Hz, thiophene ring, 1H), 7.02-6.98 (m, benzene ring, 8H and thiophene ring, 2H), 6.92 (d, J=2.0 Hz, benzene ring, 4H), 6.74 (t, J=2.0 Hz, benzene ring, 2H).

Synthesis Example 1-5

Synthesis of 2nd-generation dendritic polymer represented by the following formula

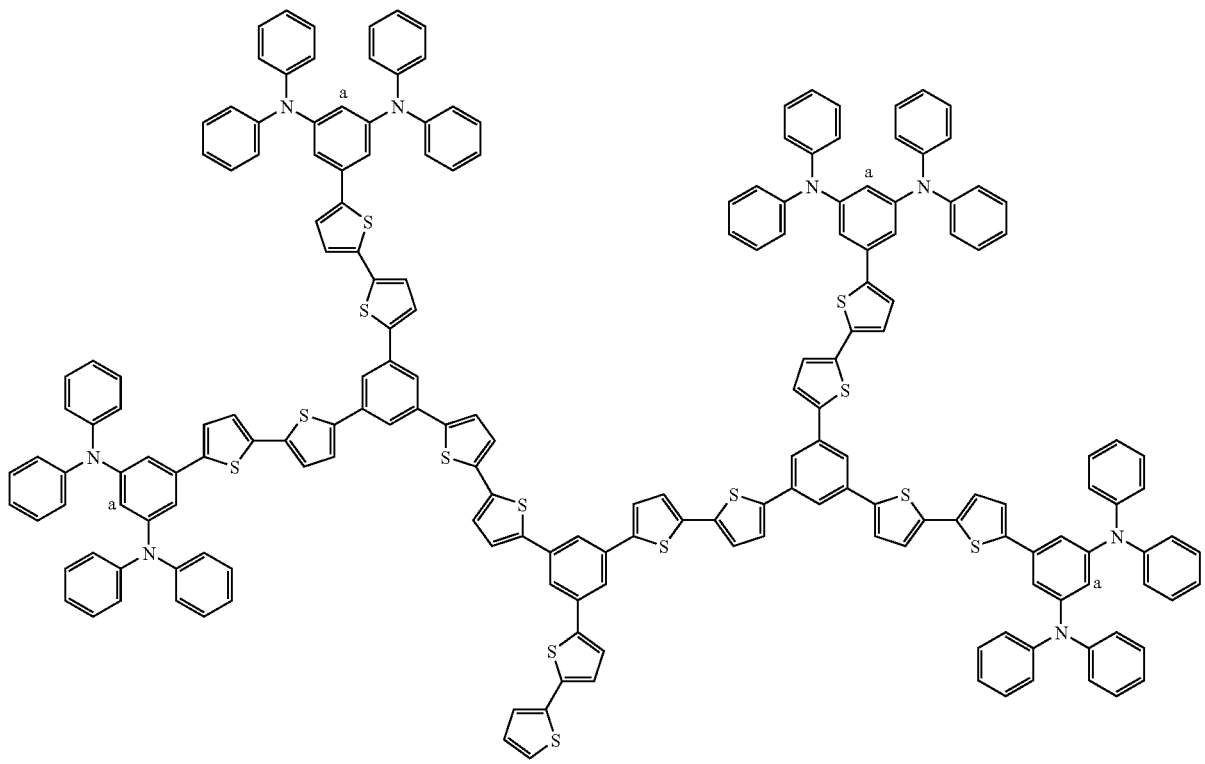

wherein, "a" represents the position of proton Ha, on which an integrated value obtained by $^1$H-NMR spectroscopy was evaluated.

<Synthesis of Boronic Acid Derivative of 1st-Generation Dendritic Polymer Represented by the Following Formula (12) Through Conversion, to Active Group B(OH)$_2$, of α-Hydrogen of the Corresponding Thiophene Ring of 1st-Generation Dendritic Polymer>

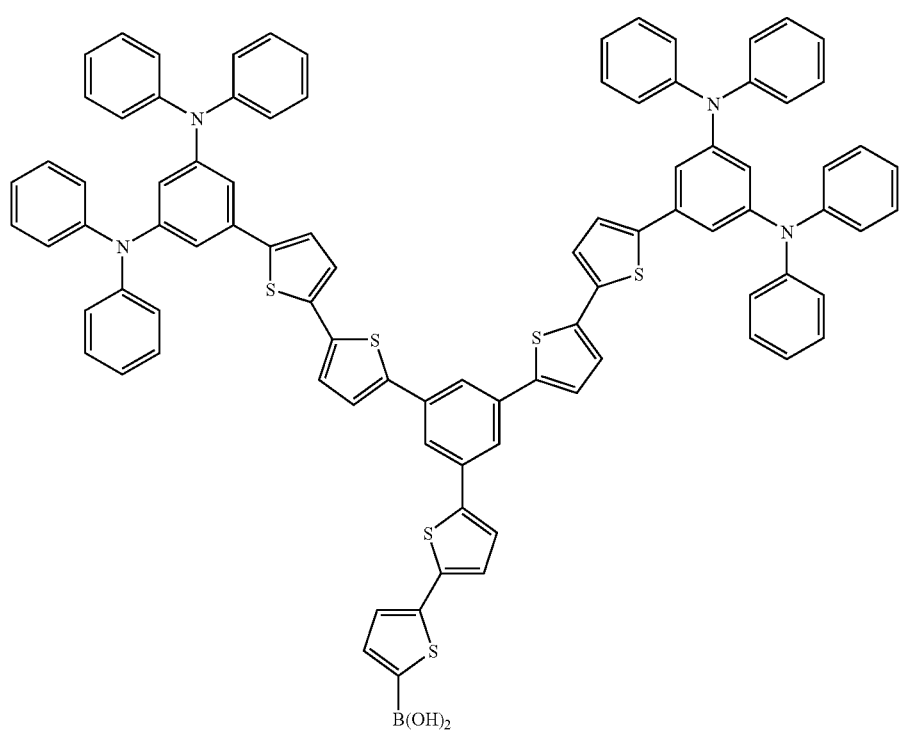

(12)

In a nitrogen atmosphere, the 1st-generation dendritic polymer (1.4 g) which had been produced in Synthesis Example 1-4 was dissolved in dehydrated tetrahydrofuran, and the solution was cooled in a dry ice—methanol bath. After cooling, a 10-wt. % lithium diisopropylamide/n-hexane suspension (2.1 g, product of Aldrich) was added dropwise thereto, and the mixture was allowed to react for one hour. Subsequently, trimethoxyborane (0.42 g) was added dropwise thereto, and the resultant mixture was allowed to react for one hour. After completion of reaction, water was added thereto for hydrolysis. Thereafter, the cooling bath was removed, whereby the temperature of the reaction mixture was elevated to room temperature. An aqueous saturated ammonium chloride solution and diethyl ether were added to the reaction mixture, and the resultant mixture was stirred and left to stand. The formed organic layer was isolated from the mixture, and the aqueous layer was subjected to extraction with a solvent mixture of tetrahydrofuran and diethyl ether (volume ratio: 1/2). The organic layer obtained through extraction was combined with the above organic layer, and the resultant mixture was washed with an aqueous saturated sodium chloride solution. The mixture was dried over sodium sulfate, and the solvent was distilled off under reduced pressure, to thereby yield a crude product. The crude product was recrystallized from tetrahydrofuran/n-hexane, to thereby yield 0.9 g of the target product; i.e., a 1st-generation boronic acid derivative (hereinafter abbreviated as "G1-B(OH)$_2$") (pale yellow solid, yield: 63%). The structure of the product was confirmed through $^1$H-NMR spectroscopy (solvent for measurement: DMSO-d$^6$) from the fact that a peak attributed to the OH proton of the boronic acid is observed at about 8.3 ppm and that the ratio of the integrated value of the benzene-ring-originating protons to that of the thiophene-ring-originating protons coincides with that of the target structure product.

<Suzuki Cross-coupling Reaction>

In a nitrogen atmosphere, THF (3 mL) and water (0.6 mL) were added to a mixture of G1-B(OH)$_2$ (0.9 g); 5-(3,5-dibromophenyl)-2,2'-bithiophene (0.12 g) which had been produced in Synthesis Example 1-1; palladium acetate (4 mg); triphenylphosphine (14 mg); and sodium carbonate (66 mg), and the resultant mixture was allowed to react for eight hours under reflux conditions. After completion of reaction, the reaction mixture was cooled to room temperature, and water (3 mL) was added thereto. The resultant mixture was subjected to extraction with methylene chloride, and the formed organic layer was washed with water. The organic layer was dried over sodium sulfate, and the solvent was distilled off under reduced pressure, to thereby yield a crude product. The crude product was isolated and purified through column chromatography (packing material: Silicagel 60 (product of Merck), eluent: methylene chloride/n-hexane), to thereby yield 0.47 g of the target product; i.e., a 2nd-generation dendritic polymer (pale yellow solid, yield: 52%). The structure of the obtained product was confirmed through $^1$H-NMR spectroscopy (solvent for measurement: CDCl$_3$) with reference to an integrated value at about 6.7 ppm (4H) attributed to benzene ring proton Ha having two adjacent nitrogen atoms, from the fact that the ratio of the integrated value of the benzene-ring-originating protons to that of the thiophene-ring-originating protons, observed at about 6.9 to about 7.4 ppm and about 7.6 to about 7.8 ppm, coincides with that of the target structure product. The weight average molecular weight (Mw), number average molecular weight (Mn), and molecular weight distribution (Mw/Mn), as measured through GPC were found to be 3,514, 3,385, and 1.038, respectively. These values indicate that the target polymer has high purity and assumes a single dispersion state.
Synthesis Example 1-6
Synthesis of 3rd-generation dendritic polymer represented by the following formula (13)
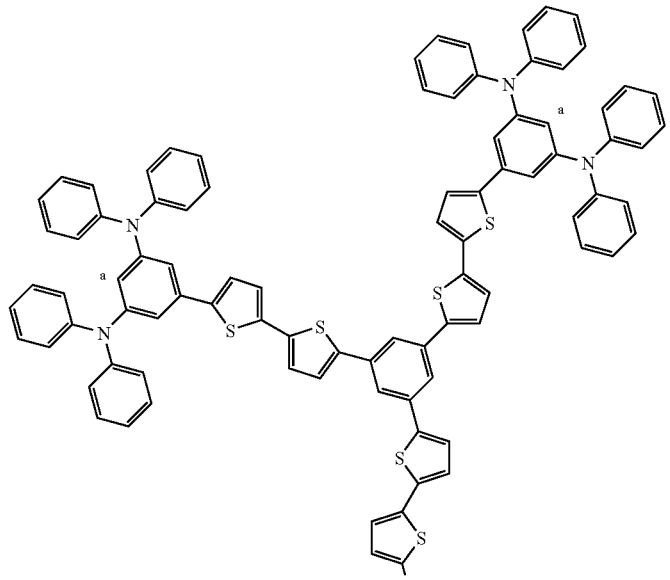
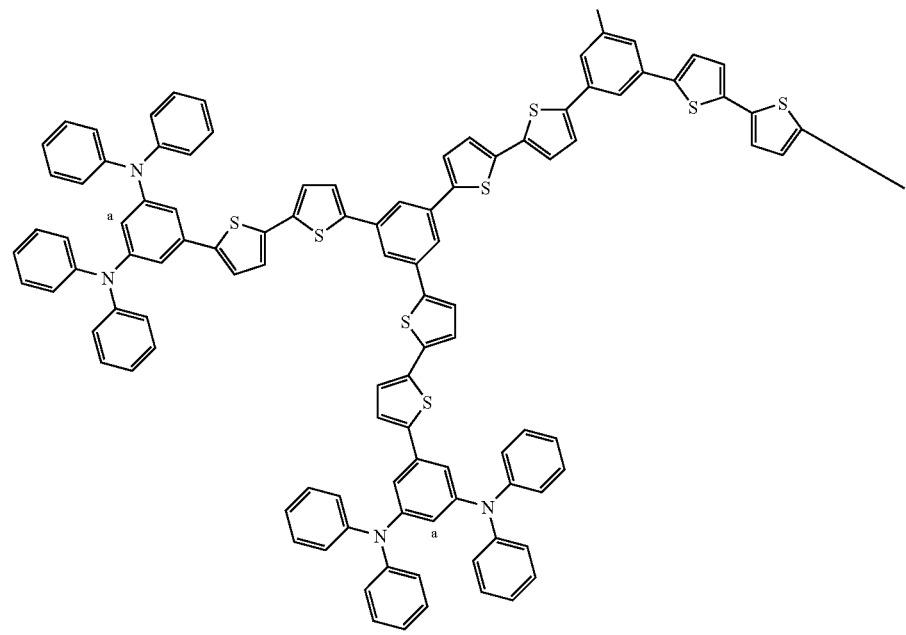

-continued

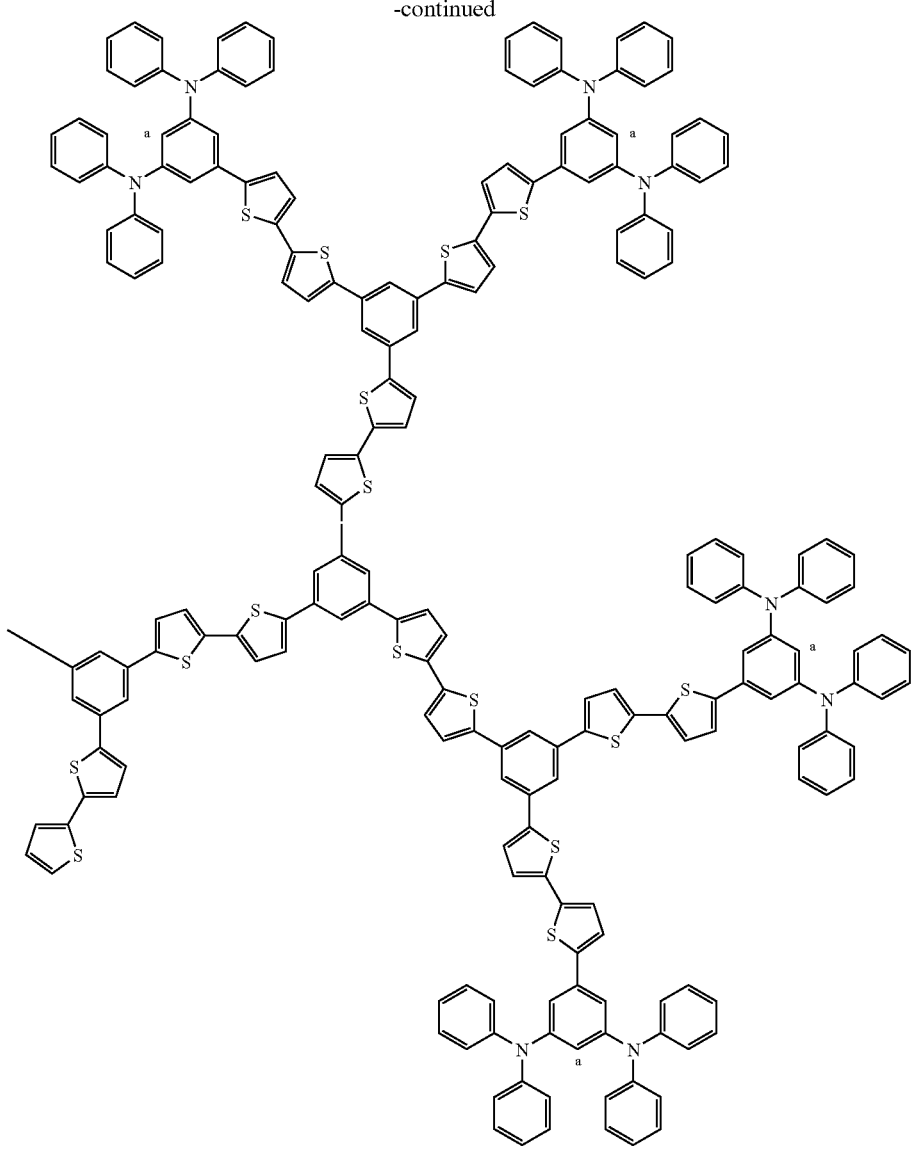

wherein, "a" represents the position of proton Ha, on which an integrated value obtained by $^1$H-NMR spectroscopy was evaluated.

A boronic acid derivative of the 2nd-generation dendritic polymer was synthesized through conversion, to active group $B(OH)_2$, of α-hydrogen of the corresponding thiophene ring of the 2nd-generation dendritic polymer which had been synthesized in Synthesis Example 1-5. Subsequently, the derivative underwent Suzuki cross-coupling reaction with 5-(3,5-dibromophenyl)-2,2'-bithiophene which had been synthesized in Synthesis Example 1-1, to thereby yield a 3rd-generation dendritic polymer. In the above synthesis, the procedure of Synthesis Example 1-5 was repeated, except that the 2nd-generation dendritic polymer was employed instead of the 1st-generation dendritic polymer. The structure of the obtained product was confirmed through $^1$H-NMR spectroscopy (solvent for measurement: $CDCl_3$) with reference to an integrated value at about 6.7 ppm (8H) attributed to benzene ring proton Ha having two adjacent nitrogen atoms, from the fact that the ratio of the integrated value of the benzene-ring-originating protons to that of the thiophene-ring-originating protons, observed at about 6.9 to about 7.4 ppm and about 7.6 to about 7.8 ppm, coincides with that of the target structure product. The weight average molecular weight (Mw), number average molecular weight (Mn), and molecular weight distribution (Mw/Mn), as measured through GPC were found to be 7,890, 7,610, and 1.037, respectively. These values indicate that the target polymer has high purity and assumes a single dispersion state.

Synthesis Example 2

1st-Generation, 3-branched dendritic polymer represented by the following formula (bonding of 1st-generation dendritic polymer to benzene core)

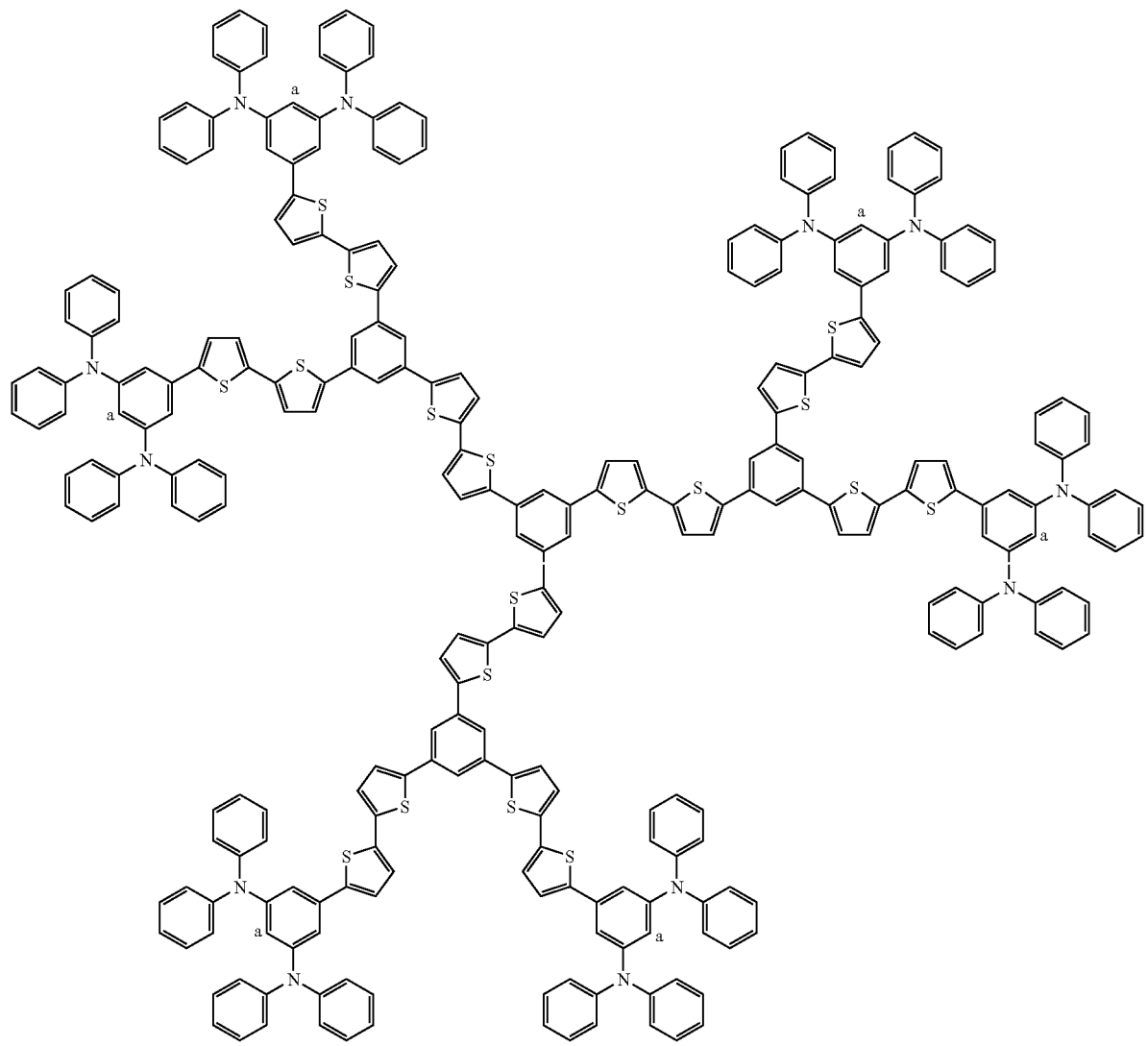

wherein, "a" represents the position of proton Ha, on which an integrated value obtained by $^1$H-NMR spectroscopy was evaluated.

In a nitrogen atmosphere, THF (6 mL) and water (1 mL) were added to a mixture of the boronic acid derivative of the 1st-generation dendritic polymer (i.e., G1-B(OH)$_2$) represented by formula (12) which had been produced through "conversion, to active group B(OH)$_2$ of α-hydrogen of the corresponding thiophene ring of 1st-generation dendritic polymer" of Synthesis Example 1-5 (1.03 g); 1,3,5-tribromobenzene (68 mg); palladium acetate (15 mg); triphenylphosphine (51 mg); and sodium carbonate (95 mg), and the resultant mixture was allowed to react for eight hours under reflux conditions. After completion of reaction, the temperature of the reaction mixture was lowered to room temperature, and water (3 mL) was added thereto. The resultant mixture was subjected to extraction with chloroform, and the formed organic layer was washed with water. The organic layer was dried over sodium sulfate, and the solvent was distilled off under reduced pressure, to thereby yield a crude product. The crude product was isolated and purified through column chromatography (packing material: Silicagel 60 (product of Merck), eluent: methylene chloride/n-hexane) and subsequently recrystallized from chloroform, to thereby yield 0.35 g of the target product; i.e., a 1st-generation, 3-branched dendritic polymer (pale yellow solid, yield: 39%). The structure of the obtained product was confirmed through $^1$H-NMR spectroscopy (solvent for measurement: CDCl$_3$) with reference to an integrated value at about 6.7 ppm (6H) attributed to benzene ring proton Ha having two adjacent nitrogen atoms, from the fact that the ratio of the integrated value of the benzene-ring-originating protons to that of the thiophene-ring-originating protons, observed at about 6.9 to about 7.2 ppm and about 7.4 to about 7.5 ppm, coincides with that of the target structure product. The measurement data are shown below. The weight average molecular weight (Mw), number average molecular weight (Mn), and molecular weight distribution (Mw/Mn), as measured through GPC were found to be 5,017, 4,667, and 1.073, respectively. These values indicate that the target polymer has high purity and assumes a single dispersion state.

$^1$H NMR (CDCl$_3$) 7.48 (s, benzene ring, 3H), 7.46 (s, benzene ring, 6H), 7.43 (s, benzene ring, 3H), 7.22-7.18 (m, benzene ring and thiophene ring, 57H), 7.10-7.08 (m, benzene ring and thiophene ring, 60H), 6.99-6.94 (m, benzene ring and thiophene ring, 33H), 6.90 (d, J=0.8 Hz, benzene ring, 12H), 6.87 (d, J=3.2 Hz, thiophene ring, 6H), 6.73 (t, J=2.0 Hz, benzene ring, 6H).

Example 1

Organic Switching Transistor Element

An organic thin film switching transistor of a reverse stagger structure containing the dendritic polymer of the present invention was fabricated. FIG. 1 schematically shows a cross-section of the transistor.

As shown in FIG. 1, the organic thin film switching transistor of a reverse stagger structure containing the dendritic polymer of the present invention includes an electrically insulating substrate 1 typically formed of glass; a gate electrode 2 provided on the substrate; a gate insulating layer 3 formed on the gate electrode 2; a drain electrode 4 and a source electrode 5 formed on the gate insulating layer; and an organic semiconductor layer 6 covering these members. The gate electrode 2 is formed of Ta, and the drain electrode 4 and source electrode 5 are formed of Au. The organic semiconductor layer 6 is formed from a 3rd-generation dendritic polymer synthesized in Synthesis Example 1-6 and having hole- and electron-conductivity (represented by formula (13)).

The organic thin film switching transistor was fabricated in the following manner. Firstly, Ta was vapor-deposited via a mask on the electrically insulating substrate 1, to thereby form the gate electrode 2. The surface of the gate electrode 2 was oxidized, to thereby form the gate insulating layer 3. Subsequently, Au was vapor-deposited via a mask on the gate insulating layer, to thereby form the drain electrode 4 and source electrode 5. The dendritic polymer which had been synthesized in Synthesis Example 1-6 (formula (13)) was applied thereto through ink-jet coating, to thereby form the organic semiconductor layer 6. The channel length was 12 μm.

The carrier mobility of the organic thin film switching transistor, as measured through the time-of-flight method, was found to be 3 $cm^2V^{-1}s^{-1}$. The on/off current ratio, obtained through evaluation of current-voltage characteristics, was found to be a level of about $10^6$. The obtained carrier mobility and the on/off current ratio were also equivalent to those of a currently employed, similar transistor containing a-Si.

The results, together with those in relation to a transistor of Comparative Example 1 shown below, indicate that performance of an organic thin film switching transistor can be drastically enhanced through employment of the dendritic polymer of the present invention.

Comparative Example 1

The procedure of Example 1 was repeated, except that oligothiophene was used to form the organic semiconductor layer, to thereby fabricate an organic thin film switching transistor employing an organic semiconductor layer formed of oligothiophene.

The carrier mobility of the organic thin film switching transistor was found to be $8.5 \times 10^{-3}$ $cm^2V^{-1}s^{-1}$, and the on/off current ratio was found to be a level of about $10^3$.

Example 2

Light-emitting Element

Figure 2:
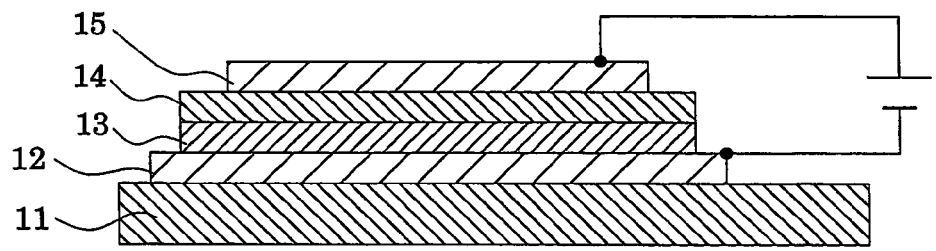
FIG. 2 is a schematic view showing a light-emitting element according to Example 2 of the present invention.

A light-emitting element containing the dendritic polymer of the present invention was fabricated. FIG. 2 schematically shows the element.

As shown in FIG. 2, the light-emitting element containing the dendritic polymer of the present invention includes a transparent glass substrate 11 for fabricating an organic light-emitting element; an electrode 12 formed thereon; a hole-injecting layer 13 and a dendritic polymer layer (hole-transporting, electron-transporting, light-emitting) 14; and an electrode 15, the layers 13 and 14 being provided between the electrodes 12 and 15.

The light-emitting element was fabricated in the following manner. Firstly, ITO (indium tin oxide) was formed on the glass substrate 11 for fabricating an light-emitting element, to thereby form the electrode 12 serving as a positive electrode. The hole-injecting layer 13 was provided in the film form from a mixture of poly(ethylenedioxythiophene) and sodium poly(styrenesulfonate) through the spin-coating method at room temperature. The thickness of the film was 50 nm. The dendritic polymer layer (hole-transporting, electron-transporting, light-emitting) 14 was provided in the film form from a solution of the dendritic polymer which had been synthesized in Synthesis Example 1-6 (formula (13)) in tetrahydrofuran through the spin-coating method at room temperature. The thickness of the film was 50 nm. Subsequently, aluminum/lithium (9:1) alloy was vapor-deposited, to thereby form the electrode 15 serving as a negative electrode. Thus, a light-emitting element was fabricated.

The light-emitting element was activated through application of a predetermined voltage, and initial luminance of emitted light was determined to be 1,500 $cd/m^2$. The time required for decreasing the initial luminance to the half value was determined to be 3,000 hours or longer.

The results, together with those in relation to an element of Comparative Example 2 shown below, indicate that element characteristics can be drastically enhanced through employment of the dendritic polymer of the present invention.

Comparative Example 2

The procedure of Example 2 was repeated, except that poly(hexylthiophene) was used to form the light-emitting layer, to thereby fabricate a light-emitting element of the same structure.

The light-emitting element was activated through application of a predetermined voltage, and initial luminance of emitted light was determined to be 800 $cd/m^2$. The time required for decreasing the initial luminance to the half value was determined to be 800 hours.

Example 3

Organic Solar Cell Element

Figure 3:
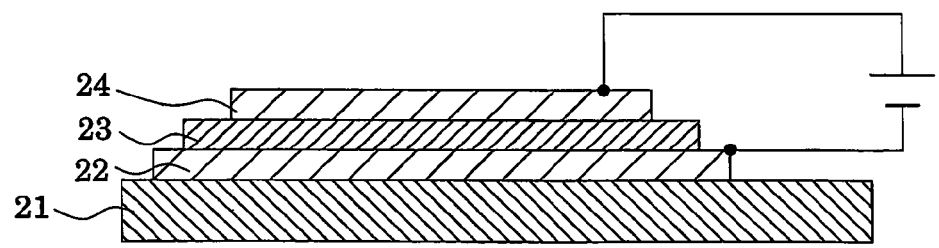
FIG. 3 is a schematic view showing an organic solar cell element according to Example 3 of the present invention.

An organic solar cell element containing the dendritic polymer of the present invention was fabricated. FIG. 3 schematically shows the element.

As shown in FIG. 3, the organic solar cell element containing the dendritic polymer of the present invention includes a transparent glass substrate 21; an electrode 22 formed on the substrate; an electrode 24; and a dendritic polymer layer 23 provided between the electrodes 22 and 24.

The organic solar cell element was fabricated in the following manner. Firstly, ITO was formed on the glass substrate 21, to thereby form the electrode 22. The dendritic polymer layer (hole-transporting, electron-transporting, light-emitting) 23 was provided in the film form from a liquid mixture containing copper phthalocyanine and a solution of the dendritic polymer (hole- and electron-conductive) which had been synthesized in Synthesis Example 1-6 (formula (13)) in tetrahydrofuran through the spin-coating method at room temperature. The thickness of the film was 50 nm. Subsequently, silver was vapor-deposited, to thereby form the electrode 24. Thus, an organic solar cell element shown in FIG. 3 was fabricated.

The organic solar cell element was irradiated with the light which was provided from a tungsten lamp and of which light beams of 400 nm or lower were cut out. Initial energy conversion efficiency was determined to be 2.3 to 3.0%, which are satisfactory.

The results, together with those in relation to an element of Comparative Example 3 shown below, indicate that element characteristics can be drastically enhanced through employment of the dendritic polymer of the present invention.

Comparative Example 3

Figure 4:
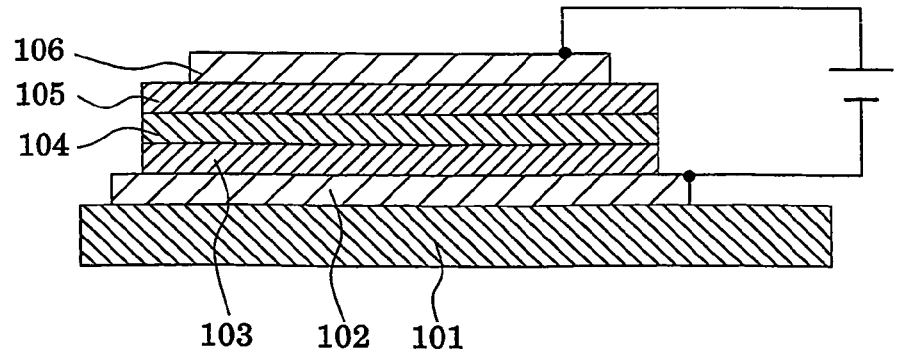
FIG. 4 is a schematic view showing an organic solar cell element according to Comparative Example 3.

An organic solar cell element of a structure which is schematically shown in FIG. 4 was fabricated.

As shown in FIG. 4, the organic solar cell element of Comparative Example 3 includes a transparent glass substrate 101; an electrode 102 formed on the substrate; a charge-generating layer 103 formed of copper phthalocyanine; an electron-conductive layer 104 formed of a hexazatriphenylene derivative; a hole-transporting layer 105 formed of a mixture of poly(ethylenedioxythiophene) and sodium poly(styrenesulfonate); and an electrode 106, these elements being stacked in this order.

The organic solar cell element was irradiated by light which was provided from a tungsten lamp and of which light beams of 400 nm or lower were cut out. Initial energy conversion efficiency was determined to be 1.7 to 2.0%.

Example 4

Organic Rectifying Element

Figure 5:
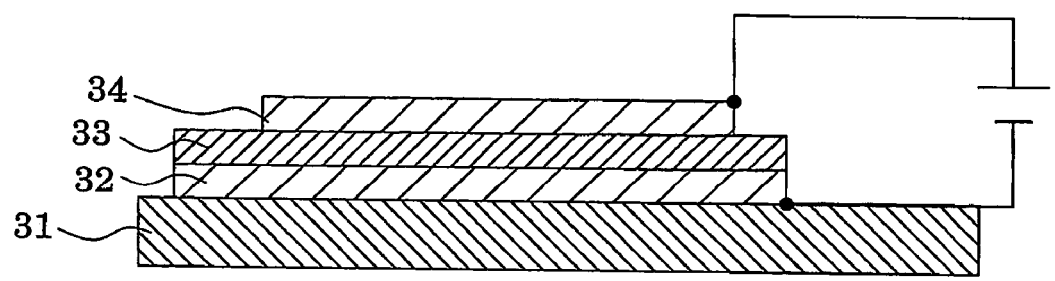
FIG. 5 is a schematic view showing an organic rectifying element according to Example 4 of the present invention.

An organic rectifying element containing the dendritic polymer of the present invention was fabricated. FIG. 5 schematically shows the element.

As shown in FIG. 5, the organic rectifying element containing the dendritic polymer of the present invention includes a transparent glass substrate 31; an electrode 32 formed thereon; a dendritic polymer layer 33; and an electrode 34, the layer 33 being provided between the electrodes 32 and 34.

The organic rectifying element was fabricated in the following manner. Firstly, ITO was formed through vapor deposition on the glass substrate 31, to thereby form the electrode 32. The dendritic polymer layer 33 was provided in the film form, through the spin-coating method at room temperature, from a solution of the dendritic polymer having hole- and electron-conductivity and produced in Synthesis Example 2 (formula 14) in NMP (N-methylpyrrolidone). The thickness of the film was 50 nm. Subsequently, Li-Al alloy was vapor-deposited, to thereby form the electrode 34. Thus, an organic rectifying element shown in FIG. 5 was fabricated.

Figure 6:
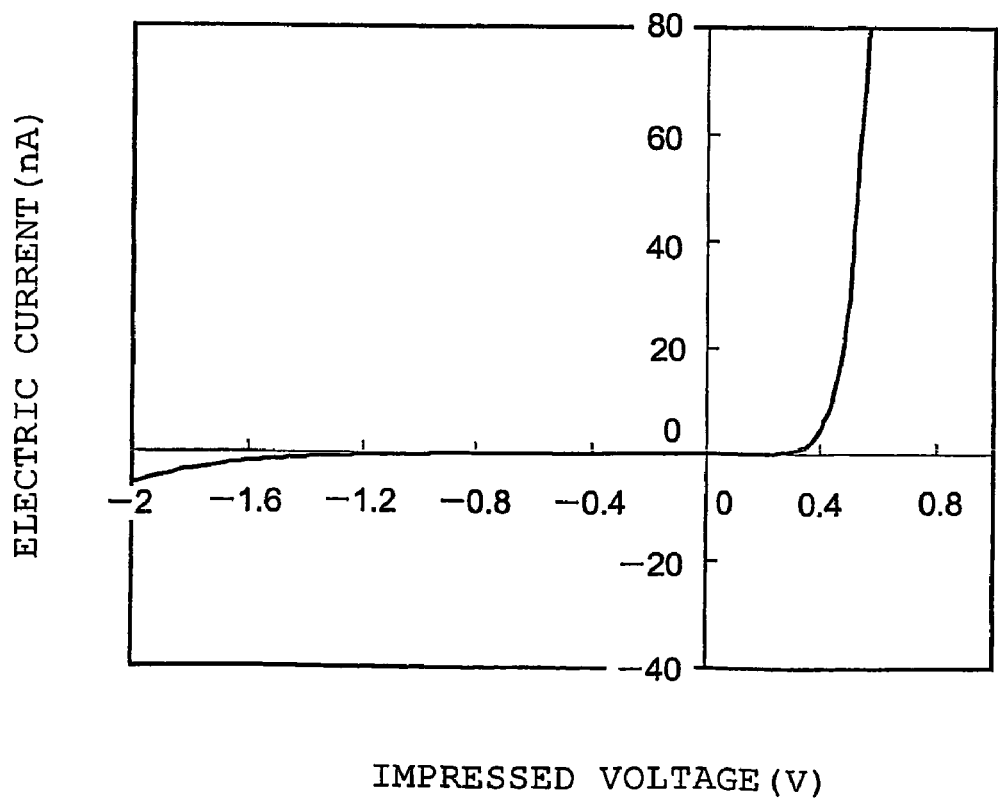
FIG. 6 is a graph showing an investigated current-voltage characteristic of the organic rectifying element according to Example 4.

The current-voltage characteristic of the organic rectifying element was investigated in the dark. The results are shown in FIG. 6. As is clear from FIG. 6, the element exhibits an insulative property in a range from about −1.3 V to about 0.3 V and a conductive property when the applied voltage is further elevated, whereby excellent rectifying characteristics can be attained.

Comparative Example 4

The procedure of Example 4 was repeated, except that poly(3-hexylthiophene) doped with antimony fluoride was used instead of the dendritic polymer layer 33 of Example 4, to thereby fabricate an organic rectifying element of Comparative Example 4.

Figure 7:
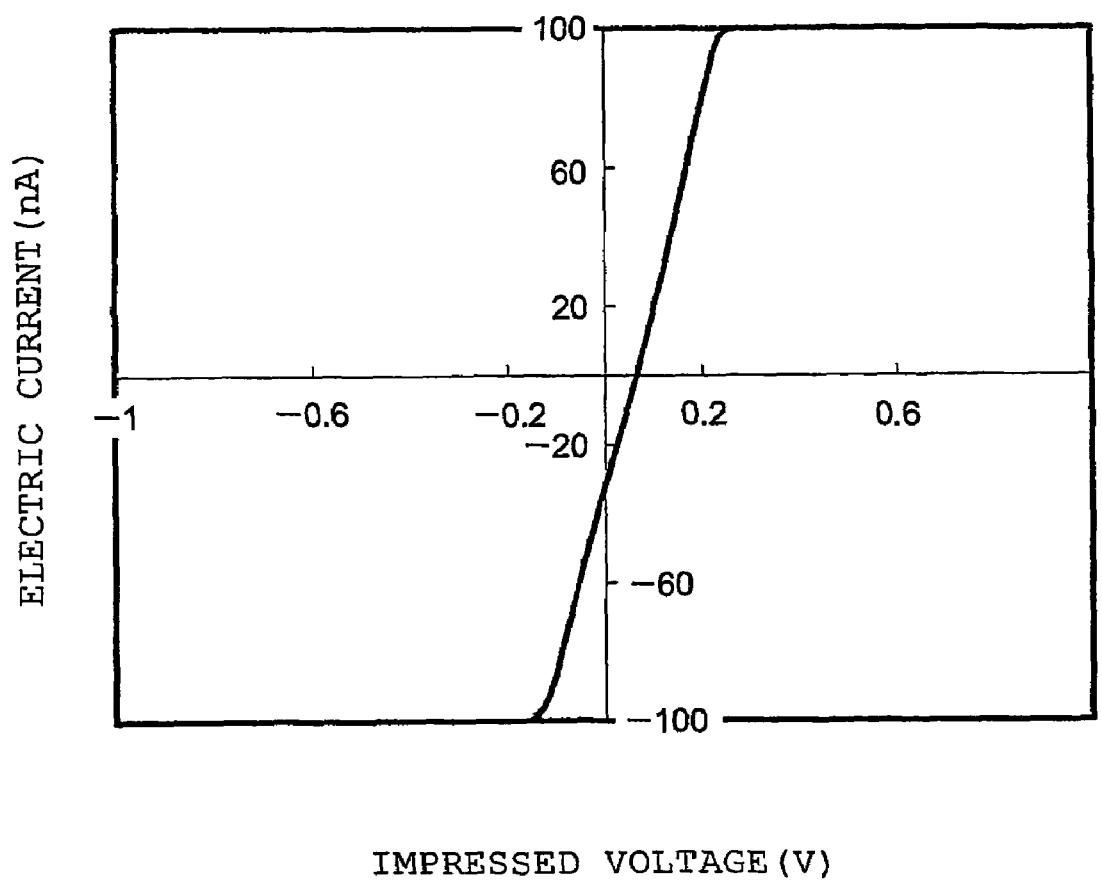
FIG. 7 is a graph showing an investigated current-voltage characteristic of the organic rectifying element according to Comparative Example 4.

The current-voltage characteristic of the organic rectifying element was investigated in the dark. The results are shown in FIG. 7. As is clear from FIG. 7, the element exhibits solo conductivity, failing to attain rectifying characteristics.

As described hereinabove, according to the present invention, a novel dendritic polymer serving as an organic semiconductor material which is isotropic and which exhibits remarkably high carrier conductivity can be provided. In addition, electronic device elements requiring carrier conductivity and having remarkably high carrier conductivity can be produced through a simple production process.

The invention claimed is:

1. A dendritic polymer having a branching structure including repeating units each having a branch portion, each of said repeating units having a structure represented by formula (1), and containing a linear portion X formed of an optionally substituted divalent organic group and a branch portion Y formed of an optionally substituted trivalent organic group:

characterized in that the linear portion X is represented by formula (3):

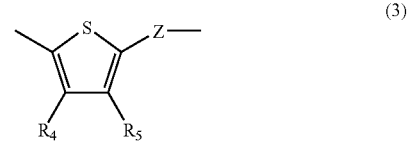

wherein Z represents a single bond or an optionally substituted divalent organic group which is at least partially conjugated with thienylene; and each of $R_4$ and $R_5$ is selected from hydrogen, an alkyl group, and an alkoxy group; and the linear portion X is at least partially conjugated with the branch portion Y;

the portion Y included in the repeating unit and serving as an end of the branching structure is bonded to end moieties which are different from the repeating unit; wherein the end moieties have hole conductivity, electron conductivity, or ion conductivity;

and in that the polymer exhibits semiconducting characteristics.

2. A dendritic polymer according to claim 1, wherein a conductive state is attained through application of electricity.

3. A dendritic polymer according to claim 1, wherein a conductive state is attained through application of photoexcitation.

4. A dendritic polymer according to claim 1, containing substantially no doping reagent.

5. A dendritic polymer according to claim 1, wherein the portion X included in the repeating unit and serving as a starting point of the branching structure is further bonded to a center moiety serving as a core.

6. A dendritic polymer according to claim 5, wherein the core is a group having a valence of at least two to which at least two of the repeating unit can be directly bonded.
7. A dendritic polymer according claim 1, wherein the end moieties are selected from the moieties represented by the following formula (I):
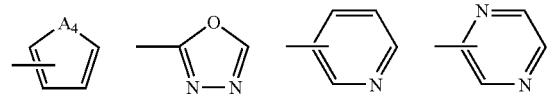
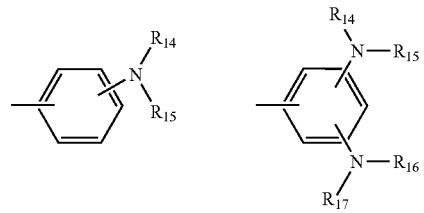
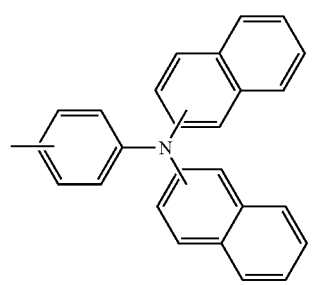
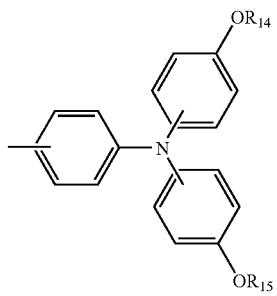
-continued
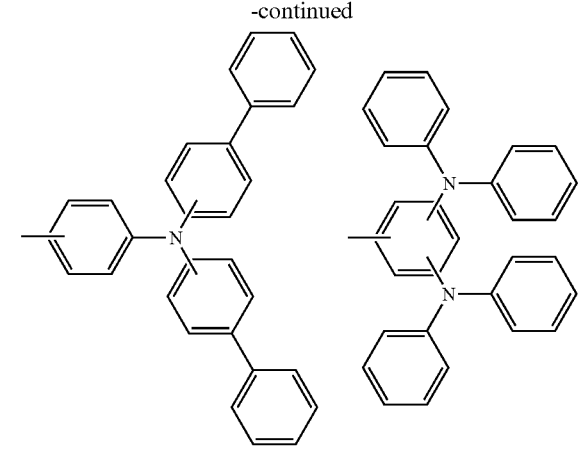
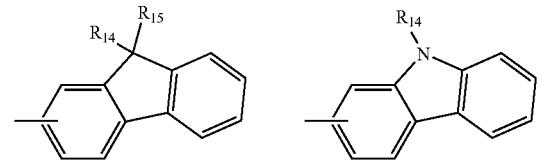
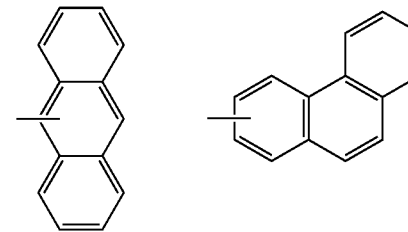
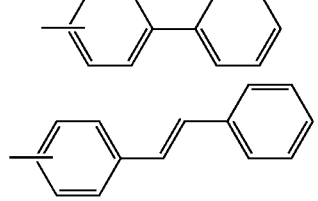
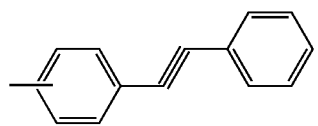
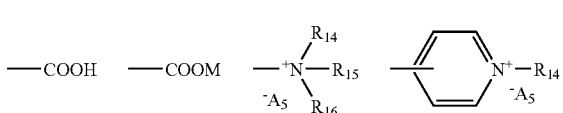
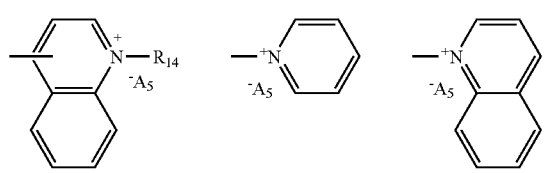
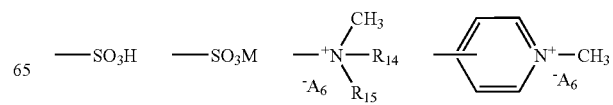

-continued

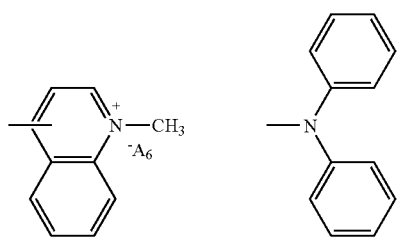

$A_4 = O, S, N\text{---}R_{18}$
$R_{14}$ to $R_{18}$ = a hydrogen atom or an alkyl group
$A_5 = Cl, Br, I$
$A_6 = CH_3SO_4$
M = Li, Na, K, ammonium, monoalkylammonium dialkylammonium, trialkylammonium, or tetraalkylammonium.

8. A dendritic polymer according to claim 1, wherein the branch portion Y includes, as a branching center, a chemical entity selected from among chain hydrocarbons (aliphatic hydrocarbons), cyclic hydrocarbons (including alicyclic compounds and aromatic compounds), and heterocyclic compounds (including aromatic heterocyclic compounds and non-aromatic heterocyclic compounds).

9. A dendritic polymer according to claim 8, wherein the branch portion Y is selected from among the moieties represented by formula (2):

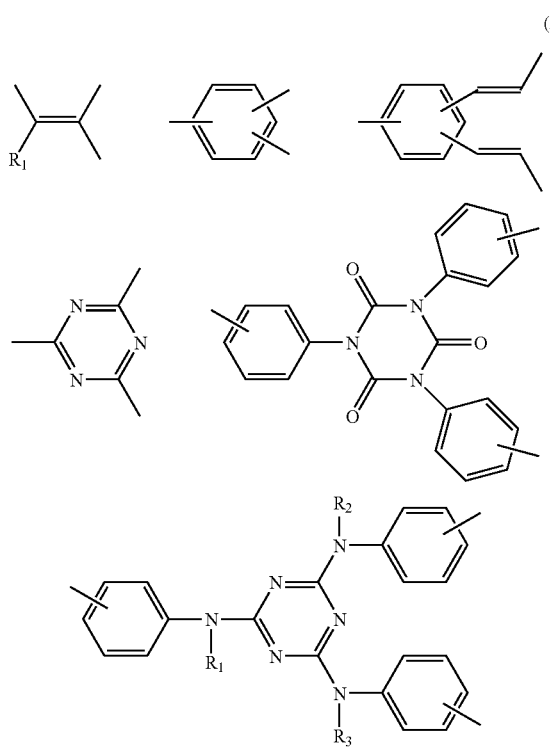

(2)

wherein each of $R_1$, $R_2$, and $R_3$ represents a hydrogen atom or an alkyl group.

10. A dendritic polymer according to any one of claims 1 to 9, wherein the linear portion X is represented by formula (3), and is at least partially conjugated with the branch portion Y:

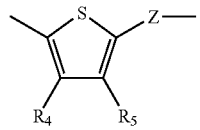

(3)

wherein Z represents a single bond or an optionally substituted divalent organic group which is at least partially conjugated with thienylene; and each of $R_4$ and $R_5$ is selected from hydrogen, an alkyl group, and an alkoxy group.

11. A dendritic polymer according to claim 1, wherein the substituent Z is a substituent formed from a moiety selected from the group consisting of substituted or unsubstituted chain hydrocarbon (aliphatic hydrocarbon) moieties, substituted or unsubstituted cyclic hydrocarbon (including alicyclic compound and aromatic compound) moieties, and substituted or unsubstituted heterocyclic compound (including aromatic heterocyclic compound and non-aromatic heterocyclic compound) moieties; a substituent formed from a plurality of same moieties continuously linked together selected from said group; or a substituent formed from a plurality of different moieties continuously linked together selected from said group.

12. A dendritic polymer according to claim 11, wherein the substituent Z is a substituent formed from a moiety selected from the group consisting of substituted or unsubstituted unsaturated aliphatic hydrocarbon moieties and substituted or unsubstituted cyclic or heterocyclic aromatic compound moieties; a substituent formed from a plurality of same moieties continuously linked together selected from said group; or a substituent formed from a plurality of different moieties continuously linked together selected from said group.

13. A dendritic polymer according to claim 12, wherein the substituent Z is a substituent formed from a moiety selected from the group represented by formula (4); a substituent formed from a plurality of same moieties continuously linked together selected from said group; or a substituent formed from a plurality of different moieties continuously linked together selected from said group:

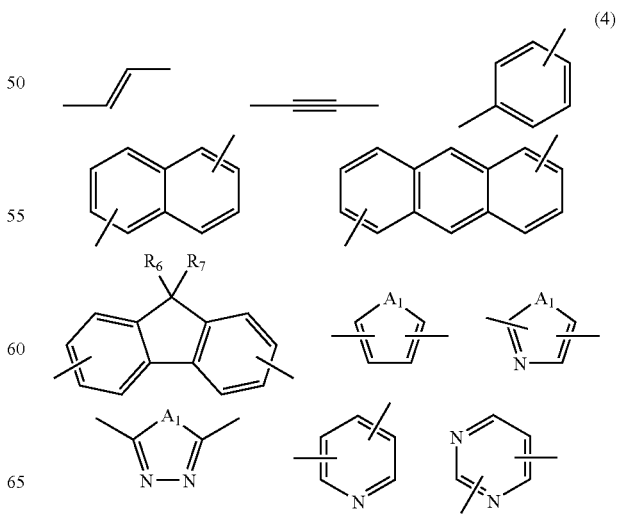

(4)

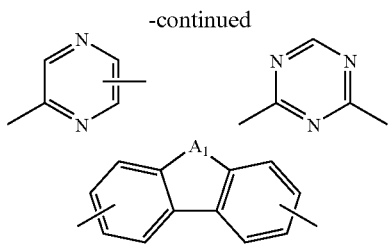

wherein $A_1$ represents O, S, or N—$R_8$, and each of $R_6$, $R_7$, and $R_8$ represents a hydrogen atom or an alkyl group.

14. A dendritic polymer according to claim 1, wherein the repeating unit is represented by formula (5):

wherein each of $R_9$ and $R_{10}$ is selected from hydrogen, an alkyl group, and an alkoxy group, and n represents an integer of 1 to 10.

15. A dendritic polymer according to claim 1, which is a dendrimer.

* * * * *